US010330259B2

(12) United States Patent
Tago et al.

(10) Patent No.: US 10,330,259 B2
(45) Date of Patent: Jun. 25, 2019

(54) CRYOSTAT INCLUDING GAS PHASE VOLUME-VARYING UNIT

(71) Applicant: JAPAN SUPERCONDUCTOR TECHNOLOGY, INC., Hyogo (JP)

(72) Inventors: Kazuhito Tago, Hyogo (JP); Yasuhide Nagahama, Hyogo (JP); Kentaro Kominato, Hyogo (JP)

(73) Assignee: JAPAN SUPERCONDUCTOR TECHNOLOGY, INC., Hyogo (JP)

(*) Notice: Subject to any disclaimer, the term of this patent is extended or adjusted under 35 U.S.C. 154(b) by 511 days.

(21) Appl. No.: 14/901,291

(22) PCT Filed: Jun. 24, 2014

(86) PCT No.: PCT/JP2014/066602
§ 371 (c)(1),
(2) Date: Dec. 28, 2015

(87) PCT Pub. No.: WO2014/208512
PCT Pub. Date: Dec. 31, 2014

(65) Prior Publication Data
US 2016/0369946 A1    Dec. 22, 2016

(30) Foreign Application Priority Data

Jun. 25, 2013    (JP) ................................ 2013-132983

(51) Int. Cl.
*F17C 6/00*    (2006.01)
*F25J 1/00*    (2006.01)
(Continued)

(52) U.S. Cl.
CPC ............... *F17C 6/00* (2013.01); *F25J 1/0007* (2013.01); *G01R 33/3804* (2013.01); *H01F 6/04* (2013.01);
(Continued)

(58) Field of Classification Search
CPC .......... F25B 9/00; F25B 9/002; F25B 49/025; F25B 2600/23; F25B 2500/12;
(Continued)

(56) References Cited

U.S. PATENT DOCUMENTS 3,379,208 A * 4/1968 Alleaume ............. F17C 13/025
                                                  137/263
6,023,420 A * 2/2000 McCormick ........ H02M 7/5387
                                                  336/212
(Continued)

FOREIGN PATENT DOCUMENTS

JP    S61-226904 A    10/1986
JP    S64-010079 A    1/1989
(Continued)

OTHER PUBLICATIONS

International Search Report; PCT/JP2014/066602; dated Sep. 22, 2014.
(Continued)

*Primary Examiner* — Frantz Jules
*Assistant Examiner* — Erik Mendoza-Wilkenfe
(74) *Attorney, Agent, or Firm* — Studebaker & Brackett PC

(57) ABSTRACT

A cryostat includes a coolant tank, a refrigerator, a cylindrical member, and a gas phase volume-varying unit. The coolant tank houses a liquid coolant. The refrigerator is provided above the coolant tank and recondenses the coolant evaporated in the coolant tank. The cylindrical member houses a lower part of the refrigerator and forms a recondensing chamber that communicates with the coolant tank. The gas phase volume-varying unit communicates with a gas-phase space above a liquid surface of the liquid coolant
(Continued)

in the coolant tank and varies a gas phase volume in the gas-phase space to cancel out a pressure fluctuation in the coolant tank.

16 Claims, 16 Drawing Sheets

(51) Int. Cl.
*F25B 9/00* (2006.01)
*H01F 6/04* (2006.01)
*G01R 33/38* (2006.01)
*G01R 33/3815* (2006.01)

(52) U.S. Cl.
CPC .......... *F17C 2250/0626* (2013.01); *F17C 2250/0663* (2013.01); *F17C 2270/02* (2013.01); *G01R 33/3815* (2013.01)

(58) Field of Classification Search
CPC .......... F25B 2500/13; F25B 2500/18; F25B 2500/19; F25B 2600/17; F17C 13/006; F17C 13/007; F17C 2201/0104; F17C 2201/032; F17C 13/086; F17C 13/087; F17C 2201/0176; F17C 2205/0338; F17C 2250/043; F17C 2250/0434; F17C 2250/0621; F17C 2205/0391; F17C 2227/048; G05B 2219/37357; H01F 6/04; H01F 6/06
See application file for complete search history.

(56) References Cited

U.S. PATENT DOCUMENTS

| | | | |
|---|---|---|---|
| 2006/0064989 A1 | 3/2006 | Roth | |
| 2006/0086101 A1* | 4/2006 | Miki | F17C 1/00 62/48.2 |
| 2007/0101742 A1* | 5/2007 | Laskaris | G01R 33/3804 62/259.2 |
| 2007/0271933 A1* | 11/2007 | Miki | C01B 3/0089 62/51.1 |
| 2009/0193816 A1* | 8/2009 | Clayton | F25D 19/00 62/47.1 |
| 2010/0037639 A1* | 2/2010 | Ogden | F25B 49/005 62/127 |
| 2013/0047632 A1* | 2/2013 | Rillo Millan | F25B 9/00 62/6 |

FOREIGN PATENT DOCUMENTS

| | | |
|---|---|---|
| JP | H04-116363 A | 4/1992 |
| JP | H04-180203 A | 6/1992 |
| JP | H08-015397 A | 1/1996 |
| JP | 2005-322756 A | 11/2005 |
| JP | 2006-184280 A | 7/2006 |
| JP | 2008-025938 A | 2/2008 |

OTHER PUBLICATIONS

Translation of Written Opinion of the International Searching Authority; PCT/JP2014/066602; dated Sep. 22, 2014.
The extended European search report issued by the European Patent Office dated Jan. 27, 2017, which corresponds to European Patent Application No. 14817255.4-1568 and is related to U.S. Appl. No. 14/901,291.

* cited by examiner

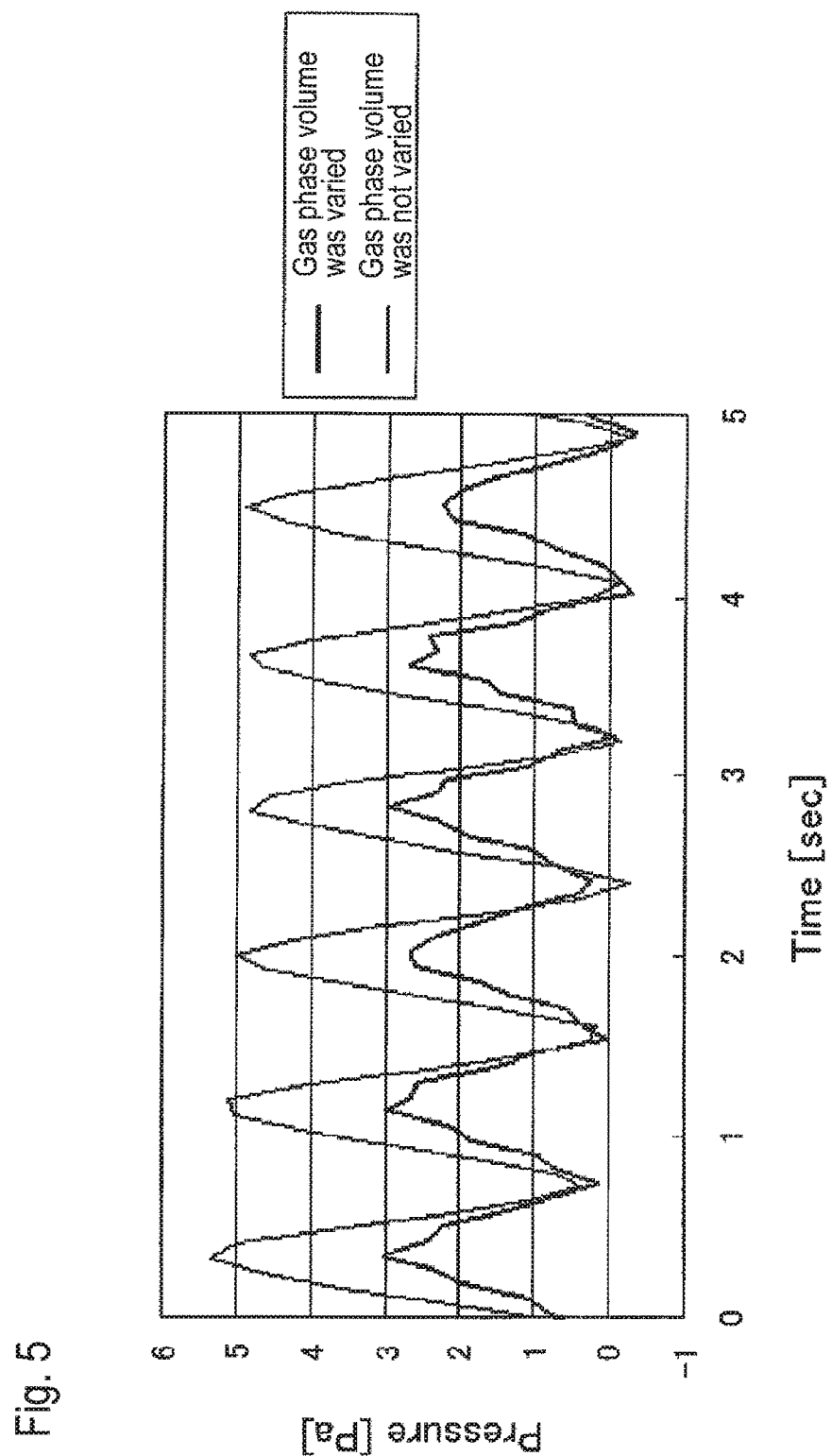

CRYOSTAT INCLUDING GAS PHASE VOLUME-VARYING UNIT

TECHNICAL FIELD

The present invention relates to a cryostat for cooling a superconducting magnet, etc.

BACKGROUND ART

In a superconducting magnet device applied to an NMR apparatus, etc., a refrigerator is used for recondensing an evaporated coolant so as to reduce the consumption of liquid helium as a coolant to zero. However, the periodic liquefaction cycle of the refrigerator generates a pressure fluctuation in a coolant tank housing a coolant and brings about a slight displacement in the coolant tank. As a result, a disturbance occurs in the magnetic field of the measurement target to produce harmful noise in the measurement results.

To cope with this problem, Patent Document 1 discloses a cryostat assembly where a plug having provided therein a large number of holes each having a diameter sufficiently smaller than the wavelength of an acoustic wave generated by the refrigerator is provided in a passage connecting a recondensing chamber housing the lower part of the refrigerator to a coolant tank housing liquid helium. The helium gas produced by evaporation of liquid helium in the coolant tank enters the recondensing chamber through the large number of holes. The liquid helium produced by the recondensation of helium gas in the recondensing chamber returns to the coolant tank through the large number of holes. An acoustic wave generated in the refrigerator is attenuated during passing through the large number of holes.

RELATED ART

Patent Document

Patent Document 1: JP-A-2006-184280

SUMMARY OF THE INVENTION

Problems that the Invention is to Solve

However, the plug of Patent Document 1 has the following problem. That is, the coolant tank is temporarily opened during maintenance of the refrigerator. On this occasion, a trace of air may get mixed into the coolant tank. The air getting mixed into the coolant tank is condensed by cooling with a coolant and remains in the coolant tank. If perchance the condensed air blocks up the large number of holes of the plug, the channel connecting the coolant tank to the recondensing chamber is closed off, leading to a fatal deficiency in the recondensing function.

An object of the present invention is to provide a cryostat capable of reducing a pressure fluctuation derived from a refrigerator.

Means for Solving the Problems

The cryostat of the present invention includes a coolant tank housing a liquid coolant, a refrigerator provided above the coolant tank, which recondenses the coolant evaporated in the coolant tank, a cylindrical member housing a lower part of the refrigerator and forming a recondensing chamber that communicates with the coolant tank, and a gas phase volume-varying unit communicating with a gas-phase space above a liquid surface of the liquid coolant in the coolant tank and varying a gas phase volume in the gas-phase space to cancel out a pressure fluctuation in the coolant tank.

Advantage of the Invention

According to the present invention, the gas phase volume in a gas-phase space is varied to cancel out a pressure fluctuation in a coolant tank by means of a gas phase volume-varying unit communicating with the gas-phase space above the liquid surface of a liquid coolant in a coolant tank. Here, a pressure fluctuation in the coolant tank is brought about by a liquefaction cycle of a refrigerator. More specifically, the pressure in the coolant tank lowers due to a decrease in the gas phase amount resulting from condensation of a given amount of a coolant when the cold is generated by the liquefaction cycle, whereas the pressure in the coolant tank rises due to an increase in the gas phase amount resulting from vaporization of the coolant when the cold is not generated by the liquefaction cycle. These two changes of state are repeated, and the pressure in the coolant tank is thereby changed periodically and continuously. Therefore, the gas phase volume in the gas-phase space is made small to raise the pressure in the coolant tank when the pressure in the coolant tank lowers due to a decrease in the gas phase amount, while the gas phase volume in the gas-phase space is made large to lower the pressure in the coolant tank when the pressure in the coolant tank rises due to an increase in the gas phase amount. In this way, the gas phase volume in the gas-phase space is varied, and the pressure fluctuation in the coolant tank is thereby canceled out. As a result, the pressure fluctuation derived from a refrigerator can be reduced.

BRIEF DESCRIPTION OF THE DRAWINGS

FIG. 5 is a graph showing the evaluation results of the pressure fluctuation.

MODE FOR CARRYING OUT THE INVENTION

Figure 1:
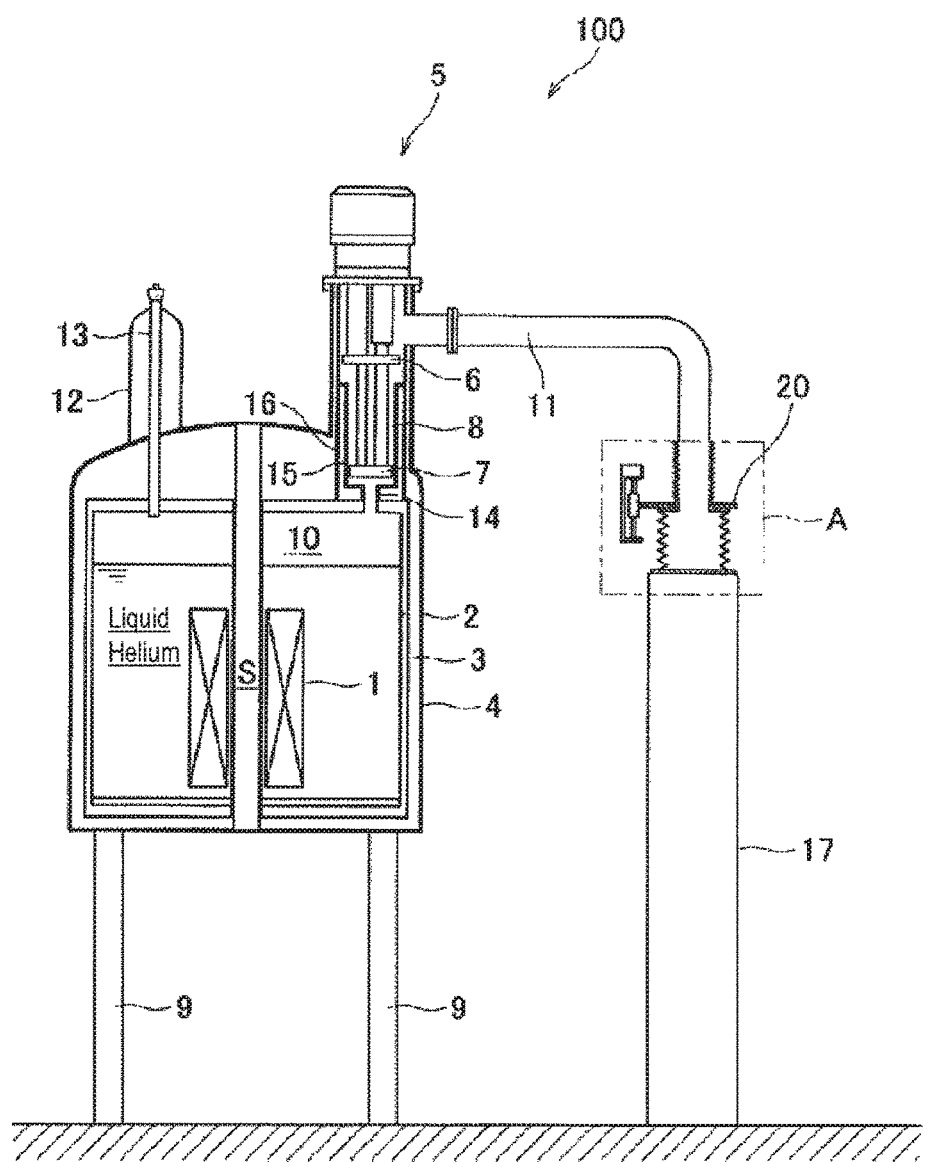
FIG. 1 is a side view illustrating the internal structure of a cryostat.

Preferred embodiments of the present invention are described below by referring to the drawings.

First Embodiment

Configuration of Cryostat

The cryostat 100 according to a first embodiment of the present invention has, as illustrated in FIG. 1, a helium tank (coolant tank) 2 housing liquid helium as a liquid coolant, a refrigerator 5 provided above the helium tank 2, a cylindrical member 15 forming a recondensing chamber 8 communicating with the helium tank 2, and a gas phase volume-varying unit 20 connected to the recondensing chamber 8. Here, the cryostat 100 of this embodiment is used in an NMR apparatus but is not limited thereto and may be used, for example, in an MRI apparatus. In addition, the coolant is not limited to helium.

In the helium tank 2, a gas release port (not shown) is provided. The gas release port is a passage through which helium gas evaporates when the capacity of the refrigerator 5 is lost, and is provided at the upper end of the later-described tube member 13. A non-return valve for preventing air from getting mixed into the helium tank 2 from outside is attached to a tip of the gas release port. The non-return value has a performance capable of sufficiently and safely treating a large amount of helium gas generated during quenching of the later-described superconducting magnet 1. Therefore, even when the helium gas in the helium tank 2 is cooled by the refrigerator 5 and liquefied, the total helium amount in the helium tank 2 is not changed. In addition, the pressure in the helium tank 2 is controlled to a positive pressure slightly higher than the atmospheric pressure so as to prevent air from getting mixed into the helium tank 2. The material of the helium tank 2 includes aluminum, stainless steel, etc.

A superconducting magnet 1 is housed in the helium tank 2. The superconducting magnet 1 is formed by spirally winding a superconducting wire around a reel (not shown). The superconducting wire may be a metal-based superconducting wire or an oxide-based superconducting wire. In addition, a cylindrical space S (bore) extending in the vertical direction is provided in the central part of the helium tank 2. A sample is put in the cylindrical space S and subjected to various analyses/experiments. In the helium tank 2, the portion above the liquid surface of liquid helium, in which the superconducting magnet 1 is immersed, is a gas-phase space 10 filled with helium gas.

The helium tank 2 is surrounded by a radiation shield 3. The radiation shield 3 is a shielding container that is cooled by the cold of the helium gas so as to more successfully prevent the escape of cold. In addition, the radiation shield 3 is force-cooled by the later-described first cooling stage 6 of the refrigerator 5. The material of the radiation shield 3 includes aluminum, copper, etc.

The helium tank 2 and the radiation shield 3 are housed in a vacuum container 4. The vacuum container 4 is a container maintaining a high vacuum in its inside and preventing heat from intruding into the superconducting magnet 1 or the helium tank 2. A neck member 12 having a tube member 13 in the inside thereof is attached to the upper part of the vacuum container 4. The tube member 13 is used as an insertion passage for a current lead (not shown) or is used as a replenishment passage for liquid helium into the helium tank 2. In addition, the vacuum container 4 is supported on a floor by a plurality of stands 9. The material of the vacuum container 4 includes aluminum, stainless steel, etc.

The refrigerator 5 is one for reliquefying (recondensing) liquid helium evaporated in the helium tank 2, and in this embodiment, a pulse tube refrigerator is used. A first cooling stage 6 (1st stage) is provided midway in the vertical direction of the refrigerator 5, and a second cooling stage 7 (2nd stage) is provided in the lower end part of the refrigerator 5. Both the first cooling stage 6 and the second cooling stage 7 have a flanged configuration and are cooled by the refrigerator 5 to reach, for example, about 40 K and about 4 K, respectively. The material of the first cooling stage 6 and the second cooling stage 7 is mainly copper or a copper alloy. The refrigerator 5 is not limited to a pulse tube refrigerator and may be a GM refrigerator, a Stirling refrigerator, etc.

The cylindrical member 15 houses the lower part including the second cooling stage 7 in the refrigerator 5. A cylindrical member 16 is further arranged on the outer side of the cylindrical member 15. The internal space of the cylindrical member 15 is the recondensing chamber 8, and the recondensing chamber 8 and the helium tank 2 are caused to communicate with each other by a cylindrical communication member 14 smaller in the diameter than the cylindrical member 15.

(Configuration of Gas Phase Volume-Varying Unit)

The gas phase volume-varying unit 20 is placed on a table 17 erected on a floor and is connected to the recondensing chamber 8 by a stainless steel-made flexible tube 11 to communicate with the gas-phase space 10 through the recondensing chamber 8. Here, the gas phase volume-varying unit 20 may communicate directly with the gas-phase space 10 without the intervention of the recondensing chamber 8. The gas phase volume-varying unit 20 varies the gas phase volume in the gas-phase space 10 to cancel out a pressure fluctuation in the helium tank 2.

Figure 2:
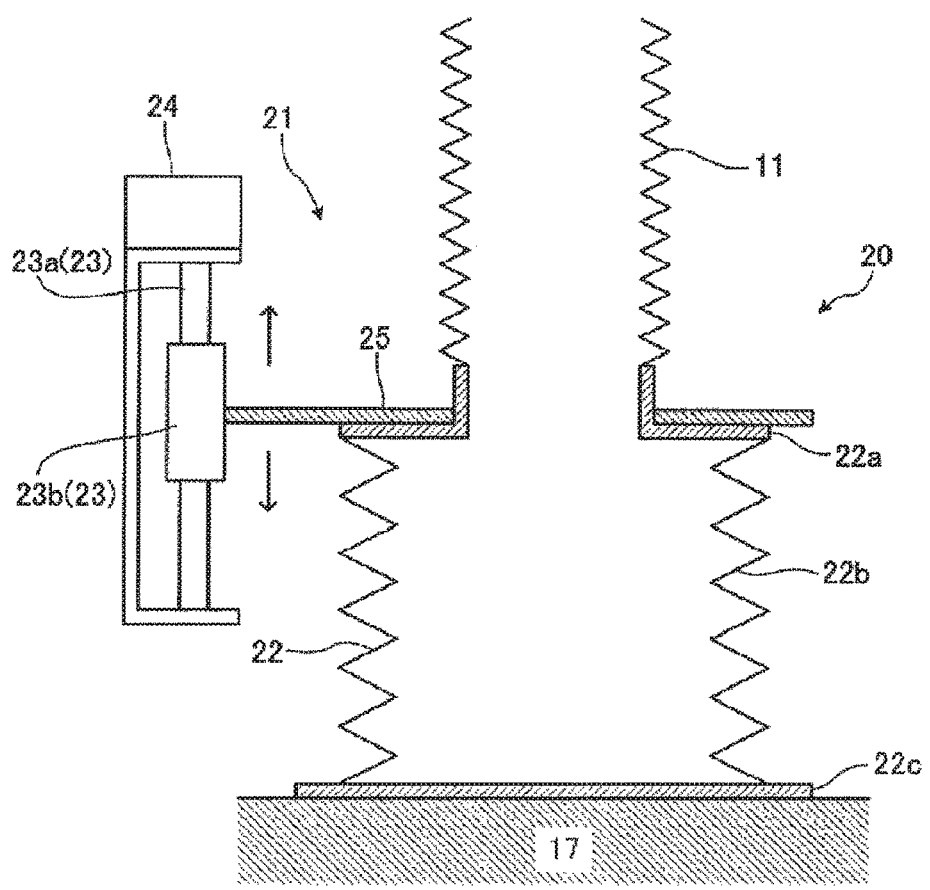
FIG. 2 is an enlarged cross-sectional view of the main part A of FIG. 1.

Specifically, as illustrated in FIG. 2 which is an enlarged cross-sectional view of the main part A of FIG. 1, the gas phase volume-varying unit 20 has a varying device 21 capable of varying the gas phase volume in the gas-phase space 10 and a differential pressure gage (pressure-measuring unit) 29 (see, FIG. 3) for measuring the pressure in the gas-phase space 10 or the recondensing chamber 8. The varying device 21 has a stainless steel-made bellows container 22 communicating with the recondensing chamber 8 through the flexible tube 11 and being volume-variable, a ball screw 23 having a screw shaft 23a and a nut 23b screwed therewith, a stepping motor 24 for rotating the screw shaft 23a, and a flat plate 25 bound to the nut 23b and fixed on the top wall 22a of the bellows container 22. The stepping motor 24 is not aware of the current position at the time of power activation and therefore, a unit for detecting the original position by a current position sensor (not shown) is necessary, but this is omitted. The differential pressure gage 29 of this embodiment is provided near the upper end of the tube member 13 (see, FIG. 1) to measure the pressure in the gas-phase space 10. The differential pressure gage 29 may be one for measuring the pressure in the recondensing chamber 8.

The side wall 22b of the bellows container 22 has a bellows structure, and the bottom wall 22c of the bellows container 22 is fixed to the table 17. In addition, an opening is provided in the center of the top wall 22a of the bellows container 22, and the flexible tube 11 is connected to the opening, whereby the inside of the bellows container 22 is filled with helium gas.

In such the configuration, when the nut 23b is moved downward by the rotation of the stepping motor 24 to move the flat plate 25 downward, the top wall 22a of the bellows container 22 is pushed downward and as a result, the volume of the bellows container 22 becomes small. On the contrary, when the nut 23b is moved upward by the rotation of the stepping motor 24 to move the flat plate 25 upward, the top wall 22a of the bellows container 22 is pushed upward and as a result, the volume of the bellows container 22 becomes large. In this way, the gas phase volume in the bellows container 22 is increased or decreased, and the gas phase volume in the gas-phase space 10 is thereby varied through the recondensing chamber 8 communicating with the bellows container 22. Here, the varying device 21 is not limited to the configuration allowing linear motion to be caused by the ball screw 23 but may have a configuration where arc motion is caused by a lever, etc.

Figure 3:
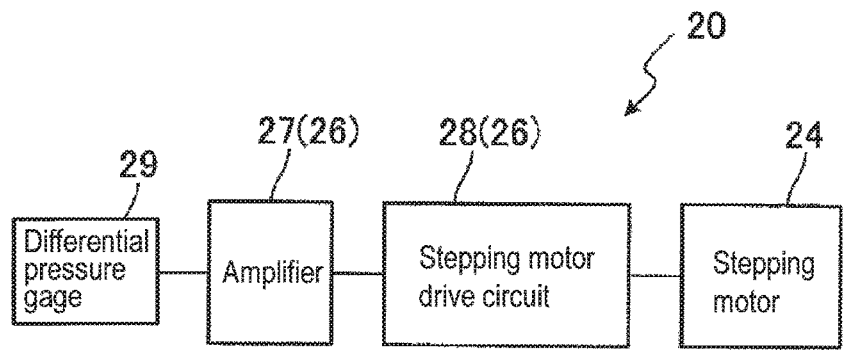
FIG. 3 is a circuit diagram of the gas phase volume-varying unit.

As illustrated in FIG. 3 which is a circuit diagram, the gas phase volume-varying unit 20 has a driving unit 26 for driving the varying device 21. The driving unit 26 has an amplifier 27 for amplifying the measurement signal measured by the differential pressure gage 29 and a stepping motor drive circuit 28 for driving the stepping motor 24. A volume for adjusting the amplification factor is attached to the amplifier 27. The stepping motor drive circuit 28 treats the output signal of the amplifier 27 as a phase signal and drives the stepping motor 24 such that the stepping motor 24 rotates at a rotation angle matching the output waveform of the amplifier 27. Here, a motor of other types, such as DC motor, may be used in place of the stepping motor 24. In this case, the output signal of the stepping motor drive circuit 28 may be analog-converted.

Figure 4:
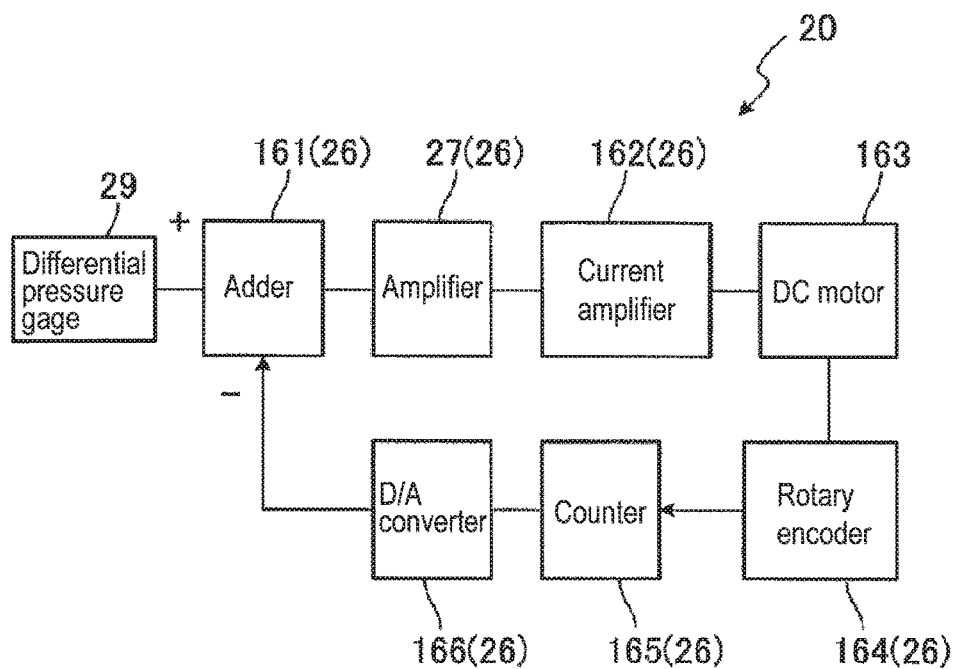
FIG. 4 is a circuit diagram of the gas phase volume-varying unit.

The driving unit 26 may be configured as illustrated in FIG. 4. That is, the measurement signal measured by the differential pressure gage 29 is amplified by the amplifier 27, and the amplified signal is then current-amplified by a current amplifier 162 and output to a DC motor 163. The rotation of the DC motor 163 is measured by a rotary encoder 164, and the pulses from the rotary encoder 164 are counted by a counter 165. The count value obtained is analog-converted by a D/A converter 166, and a difference is taken by an adder (subtracter) 161 to provide a negative feedback.

As described above, the gas phase volume-varying unit 20 varies the gas phase volume in the gas-phase space 10 to cancel out a pressure fluctuation in the helium tank 2. Here, the pressure fluctuation in the helium tank 2 is brought about by the liquefaction cycle of the refrigerator 5. That is, the pressure in the helium tank 2 lowers due to a decrease in the gas phase amount resulting from condensation of a given amount of helium gas when the cold is generated by the liquefaction cycle, whereas the pressure in the helium tank 2 rises due to an increase in the gas phase amount resulting from vaporization of liquid helium when cold is not generated by the liquefaction cycle. These two changes of state are repeated, and the pressure in the helium tank 2 is thereby changed periodically and continuously.

Therefore, when the pressure in the helium tank 2 lowers due to a decrease in the gas phase amount, the gas phase volume-varying unit 20 reduces the volume of the bellows container 22 and whereby the gas phase volume in the gas-phase space 10 is made small so as to raise the pressure in the helium tank 2. On the other hand, when the pressure in the helium tank 2 rises due to an increase in the gas phase amount, the gas phase volume-varying unit 20 increases the volume of the bellows container 22 and whereby the gas phase volume in the gas-phase space 10 is made large so as to lower the pressure in the helium tank 2. In this way, the gas phase volume in the gas-phase space 10 is varied, and the pressure fluctuation in the helium tank 2 is thereby canceled out. As a result, the pressure fluctuation derived from the refrigerator 5 can be reduced.

The driving unit 26 drives the varying device 21 to generate, in the helium tank 2, pressure of a value in an opposite phase to the measured value of the differential pressure gage 29. That is, the measured value of the differential pressure gage 29 is fed back, and the gas phase volume in the gas-phase space 10 is varied so that the measured value of the differential pressure gage 29 can become zero. By performing such feedback control, the pressure fluctuation in the helium tank 2 can be appropriately canceled out.

(Evaluation of Pressure Fluctuation)

The value of a pressure fluctuation in the helium tank 2 was experimentally evaluated on a case where the gas phase volume was varied by the gas phase volume-varying unit 20 of this embodiment and on a case where the gas phase volume was not varied. FIG. 5 shows the results. It can be seen that the pressure fluctuation in the helium tank 2 can be reduced by varying the gas phase volume in the gas-phase space 10 by the gas phase volume-varying unit 20 and thereby canceling out the pressure fluctuation in the helium tank 2.

(Evaluation of Noise of NMR Signal)

Figure 6A:
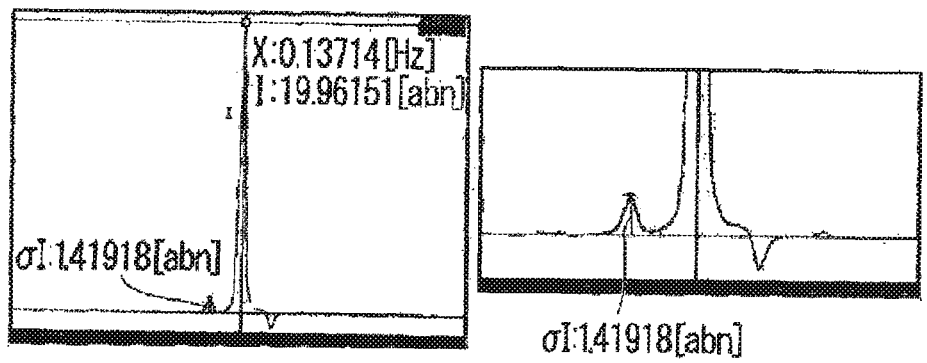
FIG. 6A is a view showing NMR signals.
Figure 6B:
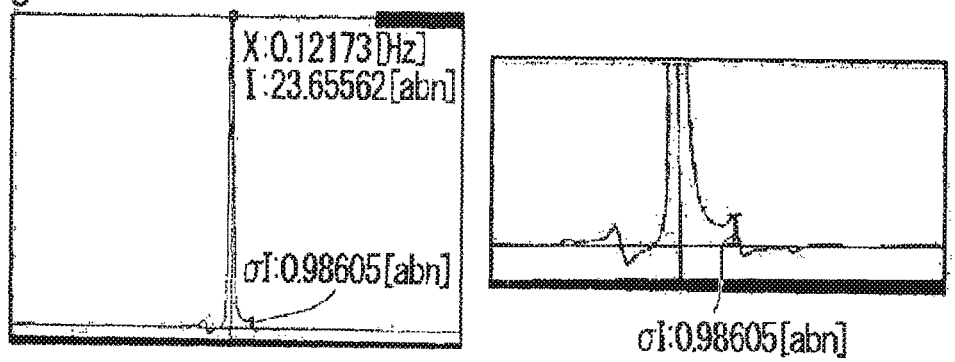
FIG. 6B is a view showing NMR signals.

The noise appearing in the NMR signal was evaluated on a case where the gas phase volume was varied by the gas phase volume-varying unit 20 of this embodiment and on a case Where the gas phase volume was not varied. FIG. 6A and FIG. 6B show the results.

In the case where the gas phase volume was not varied, as shown in FIG. 6A, noise with an intensity of 7.1% relative to the main NMR signal appeared. On the other hand, when the gas phase volume in the gas-phase space 10 was varied by the gas phase volume-varying unit 20, as shown in FIG. 6B, the intensity of noise relative to the main NMR signal was reduced to 4.1%. It can be seen from these results that when the gas phase volume is varied by the gas phase volume-varying unit 20 to reduce the pressure fluctuation in the helium tank 2, noise appearing in the NMR signal is reduced by about 40%.

(Effects)

As described above, in the cryostat 100 according to this embodiment, the gas phase volume in a gas-phase space 10 is varied to cancel out a pressure fluctuation in the helium tank 2 by means of a gas phase volume-varying unit 20 communicating with the gas-phase space 10 above the liquid surface of liquid helium in the helium tank 2. More specifically, when the pressure in the helium tank 2 lowers due to a decrease in the gas phase amount, the gas phase volume in the gas-phase space 10 is made small to raise the pressure in the helium tank 2. On the other hand, when the pressure in the helium tank 2 rises due to an increase in the gas phase amount, the gas phase volume in the gas-phase space 10 is made large to lower the pressure in the helium tank 2. In this way, the gas phase volume in the gas-phase space 10 is varied, and the pressure fluctuation in the helium tank 2 is thereby canceled out. As a result, the pressure fluctuation derived from a refrigerator 5 can be reduced.

In addition, the gas phase volume-varying unit 20 is caused to communicate with the gas-phase space 10 through a recondensing chamber 8. By allowing the gas phase volume-varying unit 20 to communicate with the vicinity of the refrigerator 5, the pressure fluctuation brought about by the liquefaction cycle of the refrigerator 5 can be appropriately canceled out.

The varying device 21 capable of varying the gas phase volume in the gas-phase space 10 is driven to generate, in the helium tank 2, a pressure of a value in an opposite phase to the measured value of a differential pressure gage 29 which measures the pressure in the gas-phase space 10. That is, the measured value of the differential pressure gage 29 is fed back, and the gas phase volume in the gas-phase space 10 is varied so that the measured value of the differential pressure gage 29 can become zero. By performing such feedback control, the pressure fluctuation in the helium tank 2 can be appropriately canceled out.

Furthermore, when a superconducting magnet 1 is housed in the helium tank 2 and used for high-resolution NMR, vibration derived from the refrigerator 5 is reduced, and noise appearing in the NMR signal can be thereby decreased.

Second Embodiment

Configuration of Gas Phase Volume-Varying Unit

Figure 7:
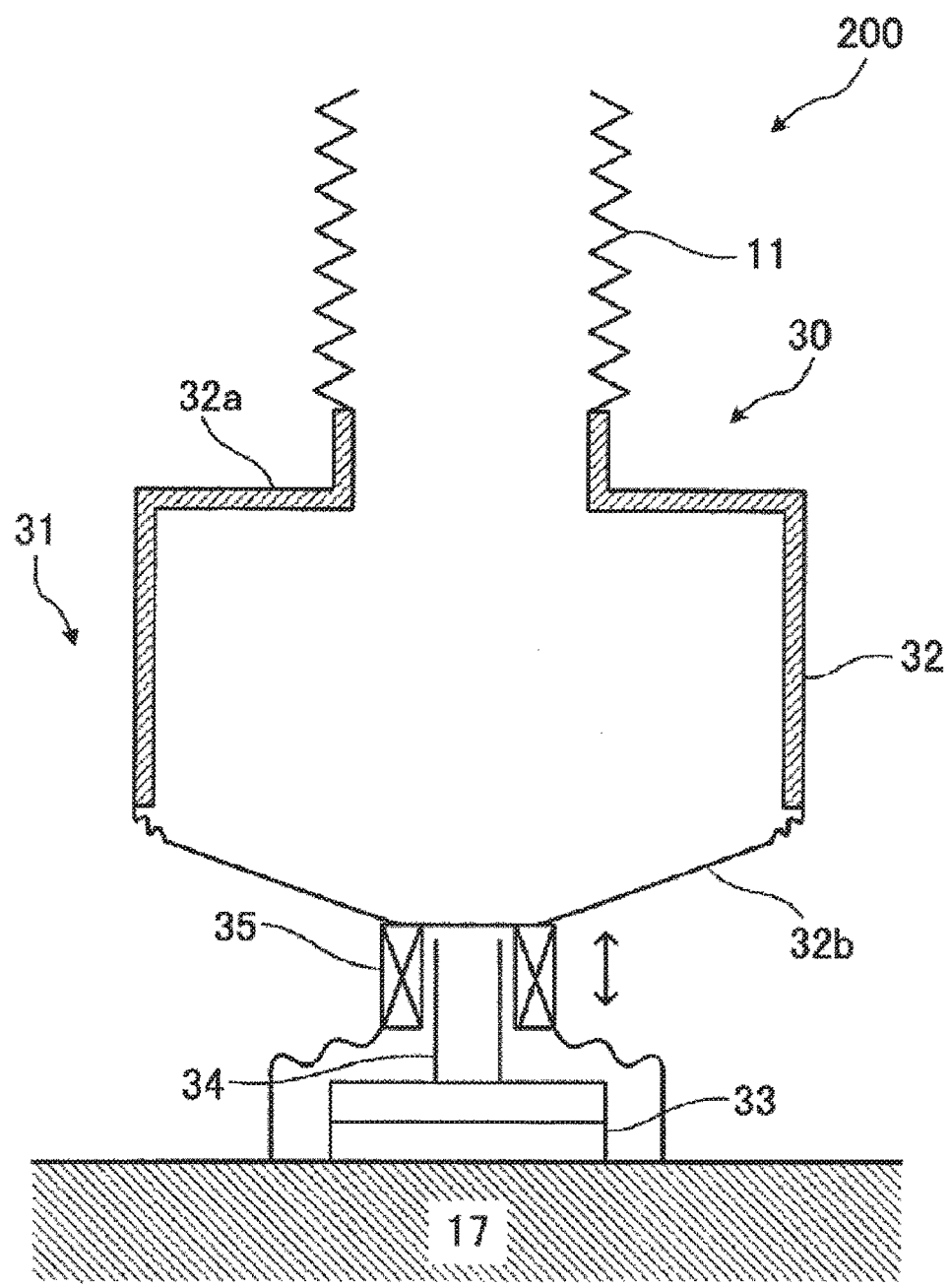
FIG. 7 is an enlarged cross-sectional view of the main part A of FIG. 1.

A cryostat 200 according to a second embodiment of the present invention is described below. With respect to the same components as the components described above, the same reference numerals are used, and the descriptions thereof are omitted. The cryostat 200 of this embodiment differs from the cryostat 100 of the first embodiment in that, as illustrated in FIG. 7 which is an enlarged cross-sectional view of the main part A of FIG. 1, the gas phase volume-varying unit 30 provided in the cryostat 200 has a varying device 31 equipped with a so-called voice coil motor.

The gas phase volume-varying unit 30 communicates with the gas-phase space 10 through the recondensing chamber 8 and has a varying device 31 capable of varying the gas phase volume in the gas-phase space 10 and the same differential pressure gage 29 (see, FIG. 8) as in the first embodiment. The varying device 31 communicates with the recondensing chamber 8 through the flexible tube 11 and has a volume-variable stainless steel-made container 32, a permanent magnet 33 fixed on the table 17, a guide 34 erected on the permanent magnet 33, and a vertically movable coil 35 wound around the guide 34 as the center. Here, the gas phase volume-varying unit 30 may communicate directly with the gas-phase space 10 without the intervention of the recondensing chamber 8.

The bottom wall of the container 32 is a stainless steel-made diaphragm 32b. In addition, an opening is provided in the center of the top wall 32a of the container 32, and the flexible tube 11 is connected to the opening, whereby the inside of the container 32 is filled with helium gas. The upper end of the coil 35 is fixed to the diaphragm 32b. The diaphragm 32b is not limited to a stainless steel-made but may be a rubber-made or silicon-made one. The diaphragm 32b preferably has strength enough to cause no rupture during quenching. In the case of using a soft member as the diaphragm 32b, a grid-like backup member is preferably provided to guard against an unexpected rise of the internal pressure. In addition, the permanent magnet 33 is preferably one not emitting a magnetic field toward the outside as much as possible or one sufficiently provided with magnetic shield. The diaphragm 32b may be changed to a thin film, and the permanent magnet 33 and the coil 35 may be changed to a speaker.

In such a configuration, when the direction of a current flowing through the coil 35 is a direction of the coil 35 departing from the permanent magnet 33, the diaphragm 32b is pushed upward and in turn, the volume of the container 32 becomes small. Conversely, when the direction of a current flowing through the coil 35 is a direction of the coil 35 approaching the permanent magnet 33, the diaphragm 32b is pulled downward and in tarn, the volume of the container 32 becomes large. In this way, the gas phase volume in the container 32 is increased or decreased, and the gas phase volume in the gas-phase space 10 is thereby varied through the recondensing chamber 8 communicating with the container 32.

Figure 8:
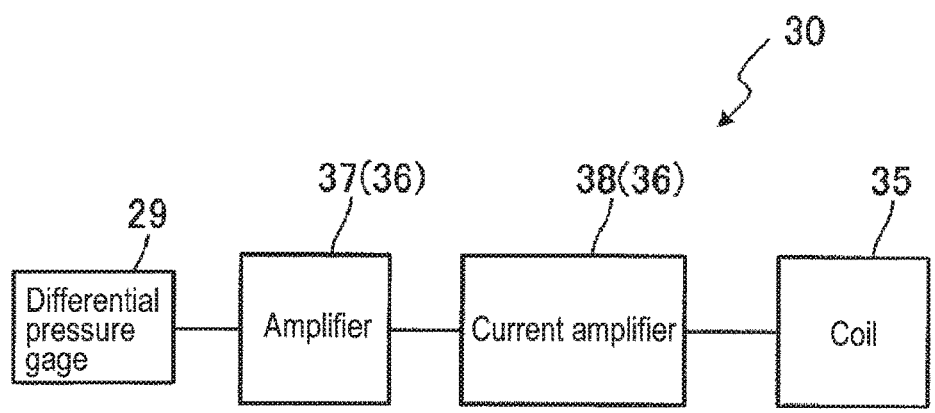
FIG. 8 is a circuit diagram of the gas phase volume-varying unit.

As illustrated in FIG. 8 which is a circuit diagram, the gas phase volume-varying unit 30 has a driving unit 36 for driving the varying device 31. The driving unit 36 has an amplifier 37 for amplifying the measurement signal measured by the differential pressure gage 29 and a current amplifier 38 for current-amplifying the voltage signal obtained in the amplifier 37 and outputting the amplified signal to the coil 35.

The gas phase volume-varying unit 30 varies the gas phase volume in the gas-phase space 10 to cancel out a pressure fluctuation in the helium tank 2. More specifically, when the pressure in the helium tank 2 lowers due to a decrease in the gas phase amount, the gas phase volume in the gas-phase space 10 is made small by reducing the volume of the container 32 so as to raise the pressure in the helium tank 2. On the other hand, when the pressure in the helium tank 2 rises due to an increase in the gas phase amount, the gas phase volume in the gas-phase space 10 is made large by increasing the volume of the container 32 so as to lower the pressure in the helium tank 2. In this way, the gas phase volume in the gas-phase space 10 is varied, and the pressure fluctuation in the helium tank 2 is thereby canceled out. As a result, the pressure fluctuation derived from the refrigerator 5 can be reduced.

The driving unit 36 drives the varying device 31 to generate, in the helium tank 2, a pressure of a value in an opposite phase to the measured value of the differential pressure gage 29. That is, the measured value of the differential pressure gage 29 is fed back, and the gas phase volume in the gas-phase space 10 is varied so that the measured value of the differential pressure gage 29 can become zero. In FIG. 7, assuming that when a plus voltage is applied to the coil 35, the coil 35 moves to approach the permanent magnet 33 and that the measured value of the differential pressure gage 29 is a positive value, i.e., the pressure is high, this yields a configuration where the input and output of the amplifier 37 are not inverted (the input is positive and the output is positive). Then, negative feedback using the differential pressure gage signal is performed, and the pressure fluctuation in the helium tank 2 can be appropriately canceled out. Depending on the configuration of the driving unit 36, the amplifier 37 is an inverted one (negative output when the input is positive), and the phase may be reversed. Here, the pressure of a value in an opposite phase indicates to drive the varying device 31 in the direction of the pressure becoming lower when the pressure measured by the differential pressure gage 29 is high. In such a way, the pressure of a value in an opposite phase can be realized by causing the driving unit 36 to drive the varying device 31 in the direction of canceling out the pressure fluctuation or by performing inversion (negative output when the input is positive) by the amplifier 37, and this can be configured even by a simple analog circuit. From the standpoint of improving the control characteristics, it is preferable depending on the case to add, to the driving unit 36, a compensation for adding an integral element or a differentiating element as in PID control.

(Effects)

As described above, in the cryostat 200 according to this embodiment, the similar effects as those of the cryostat 100 of the first embodiment can be obtained.

(Modification Example)

Figure 9:
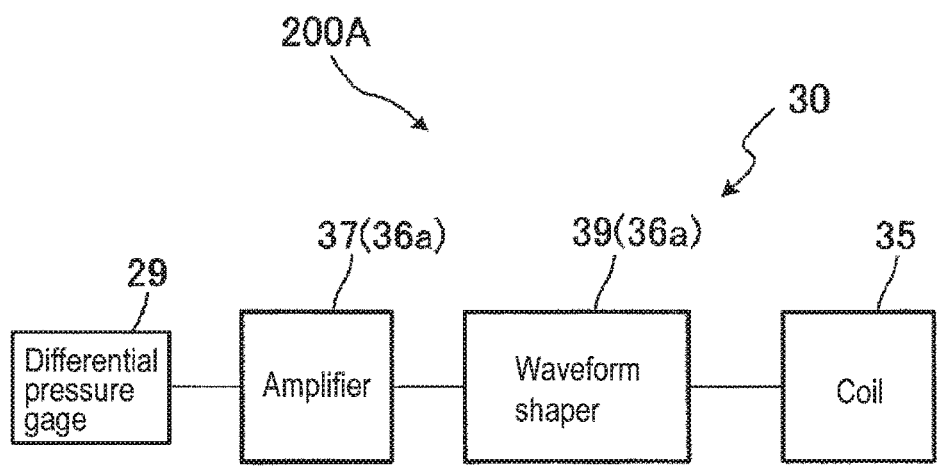
FIG. 9 is a circuit diagram of the gas phase volume-varying unit.

In the cryostat 200A according to a modification example of this embodiment, as illustrated in FIG. 9 which is a circuit diagram, the gas phase volume-varying unit 30 may have a driving unit 36a in place of the driving unit 36. The driving unit 36a has a waveform shaper 39 in place of the current amplifier 38. The waveform shaper 39 may be provided with a phase adjusting circuit for delaying the output by a given time or with a time lag to inhibit the reaction for a given time.

In the results of some experiments, the pressure fluctuation was reduced when the varying device 31 was driven to generate, in the helium tank 2, a pressure in a phase delayed by about 300 relative to a value in an opposite phase to the measured value of the differential pressure gage 29, rather than when the varying device 31 is driven to generate, in the helium tank 2, a pressure of the value in an opposite phase. Accordingly, the driving unit 36a drives the varying device 31 to generate, in the helium tank 2, a pressure of a value in an opposite phase to the measured value of the differential pressure gage 29 after a predetermined time delay. Specifically, the varying device 31 is driven to generate, in the helium tank 2, a pressure in a phase delayed by about 30° relative to the value in an opposite phase. In this way, the pressure fluctuation in the helium tank 2 can be appropriately canceled out. The circuit for delaying the phase may be realized by a circuit having a normal configuration, but it can be rather simply realized by digital processing in a microcomputer.

Conversely, in the case where it is advantageous to advance the phase relative to the value in an opposite phase, the phase preferably be delayed relative to an input of which phase is not reversed. Accordingly, the driving unit 36a drives the varying device 31 to generate, in the helium tank 2, a pressure of the measured value of the differential pressure gage 29 after a predetermined time delay. It seems that the effect of such phase adjustment is exerted because the change in the pressure inside the helium tank 2 delays according to the place and the pressure in the main portion lags behind the signal of the differential pressure gage 29. This relationship may be reversed depending on the arrangement of the differential pressure gage 29.

(Effects)

As described above, in the cryostat 200A according to this modification example, the varying device 31 capable of varying the gas phase volume in the gas-phase space 10 is driven to generate, in the helium tank 2, a pressure of the measured value or a pressure of a value in an opposite phase to the measured value of the differential pressure gage 29 which measures the pressure in the gas-phase space 10 or the recondensing chamber 8, after a predetermined time delay. In some cases, the pressure fluctuation can be more reduced when the varying device 31 is driven to generate, in the helium tank 2, a pressure of the measured value or a pressure of a value in an opposite phase to the measured value of the differential pressure gage 29 after a predetermined time delay, than when the varying device 31 is driven to generate, in the helium tank 2, a pressure of a value in an opposite phase to the measured value. By performing such feedback control, the pressure fluctuation in the helium tank 2 can be appropriately canceled out.

Third Embodiment

Configuration of Gas Phase Volume-Varying Unit

Figure 10:
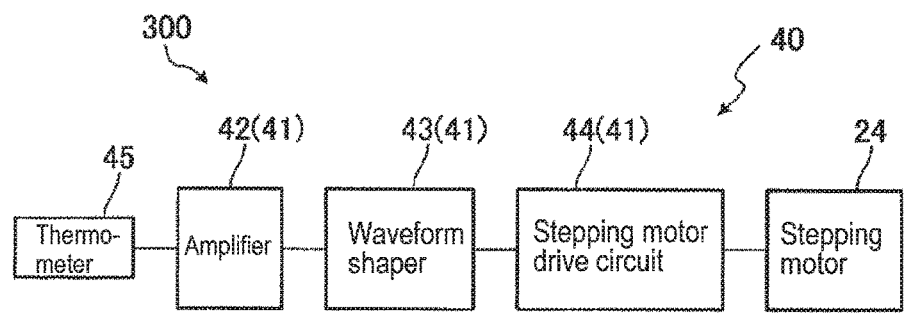
FIG. 10 is a circuit diagram of the gas phase volume-varying unit.

A cryostat 300 according to a third embodiment of the present invention is described below. With respect to the same components as the components described above, the same reference numerals are used, and the descriptions thereof are omitted. The cryostat 300 of this embodiment differs from the cryostat 100 of the first embodiment in that, as illustrated in FIG. 10 which is a circuit diagram, the gas phase volume-varying unit 40 provided in the cryostat 300 has, in place of the differential pressure gage 29, a thermometer (temperature-measuring unit) 45 for measuring the temperature of the refrigerator 5.

In this embodiment, the thermometer 45 is attached (not shown) to the second cooling stage 7 (see, FIG. 1) of the refrigerator 5 and measures the temperature of the second cooling stage 7.

The gas phase volume-varying unit 40 has a driving unit 41 for driving the varying device 21 (see, FIG. 2). The driving unit 41 has an amplifier 42 for amplifying the measurement signal measured by the thermometer 45, a waveform shaper 43 for waveform-shaping the voltage signal obtained by the amplifier 42, and a stepping motor drive circuit 44 for driving a stepping motor 24 with an output waveform shaped by the waveform shaper 43.

The driving unit 41 drives the varying device 21 with a waveform in an opposite phase to the waveform of the temperature fluctuation measured by the thermometer 45. As with the pressure fluctuation in the helium tank 2, the temperature fluctuation of the refrigerator 5 measured by the thermometer 45 is derived from the liquefaction cycle of the refrigerator 5. In turn, the waveform of the temperature fluctuation of the refrigerator 5 well resembles the waveform of the pressure fluctuation in the helium tank 2. Therefore, the pressure fluctuation in the helium tank 2 can be appropriately canceled out by varying the gas phase volume in the gas-phase space 10 with a waveform in an opposite phase to the waveform of the temperature fluctuation measured by the thermometer 45.

Although the waveform of the temperature fluctuation of the refrigerator 5 well resembles the waveform of the pressure fluctuation in the helium tank 2, in the temperature fluctuation, a temperature change of the refrigerator 5 is transmitted by a metal, whereas in the pressure fluctuation, the fluctuation of pressure is itself generated with a delay or is transmitted through helium gas. In turn, the pressure fluctuation usually lags behind the temperature fluctuation in many cases. Therefore, in the case of controlling the pressure by using temperature fluctuation, an appropriate amount of phase adjustment (mostly, phase delay) is added after the waveform of the temperature fluctuation measured by the thermometer 45 is inverted to reverse the phase, and then, the pressure fluctuation in the helium tank 2 can be more appropriately canceled out.

(Effects)

As described above, in the cryostat 300 according to this embodiment, a varying device 21 is driven, which is capable of varying the gas phase volume in the gas-phase space 10 with a waveform in an opposite phase to the waveform of the temperature fluctuation measured by the thermometer 45 measuring the temperature of the refrigerator 5. As with the pressure fluctuation in the helium tank 2, the temperature fluctuation of the refrigerator 5 measured by the thermometer 45 is derived from the liquefaction cycle of the refrigerator 5. In turn, the waveform of the temperature fluctuation of the refrigerator 5 well resembles the waveform of the pressure fluctuation in the helium tank 2.

Therefore, the pressure fluctuation in the helium tank 2 can be appropriately canceled out by varying the gas phase volume in the gas-phase space 10 with a waveform in an opposite phase to the waveform of the temperature fluctuation measured by the thermometer 45.

(Modification Example)

In the cryostat according to a modification example of this embodiment, the driving unit 41 drives the varying device 21 with a phase-adjusted waveform relative to the waveform of the temperature fluctuation measured by the thermometer 45. Although the waveform of the temperature fluctuation of the refrigerator 5 well resembles the waveform of the pressure fluctuation in the helium tank 2, in the temperature fluctuation, a temperature change of the refrigerator 5 is transmitted by a metal, whereas in the pressure fluctuation, the fluctuation of pressure is itself generated with a delay or is transmitted through helium gas. In turn, the pressure fluctuation usually lags behind the temperature fluctuation in many cases. Therefore, in the case of controlling the pressure by using temperature fluctuation, it is sometimes preferably controlled by adjusting the phase to supply, for example, a 60° delay relative to the temperature fluctuation. Furthermore, when the pressure is controlled by using a pressure fluctuation, the pressure fluctuation ideally becomes zero, but in the case of controlling the pressure by using a temperature fluctuation, even when the pressure fluctuation ideally becomes zero in the same manner, the temperature fluctuation is usually not changed. Accordingly, in the case of controlling the pressure by a temperature fluctuation, even when the phase is greatly shifted, an instability of taking the delay into the feedback system is not produced. As a result, the properties can be improved by an optimal phase adjustment and since there is no trade-off relationship that the delay of information for adjusting the phase makes the control unstable, the optimal phase adjustment can be made more freely without any limitation.

(Effects)

As described above, in the cryostat according to this modification example, a varying device 21 is driven, which is capable of varying the gas phase volume in the gas-phase space 10 with a phase-adjusted waveform relative to the waveform of the temperature fluctuation measured by the thermometer 45 measuring the temperature of the refrigerator 5. The waveform of the temperature fluctuation of the refrigerator 5 well resembles the waveform of the pressure fluctuation in the helium tank 2, but the pressure fluctuation usually lags behind the temperature fluctuation in many cases. Therefore, the varying device 21 is driven with a waveform phase-adjusted to supply, for example, a 60° delay relative to the waveform of the temperature fluctuation, whereby the pressure fluctuation in the helium tank 2 can be appropriately canceled out.

Fourth Embodiment

Configuration of Gas Phase Volume-Varying Unit

Figure 11:
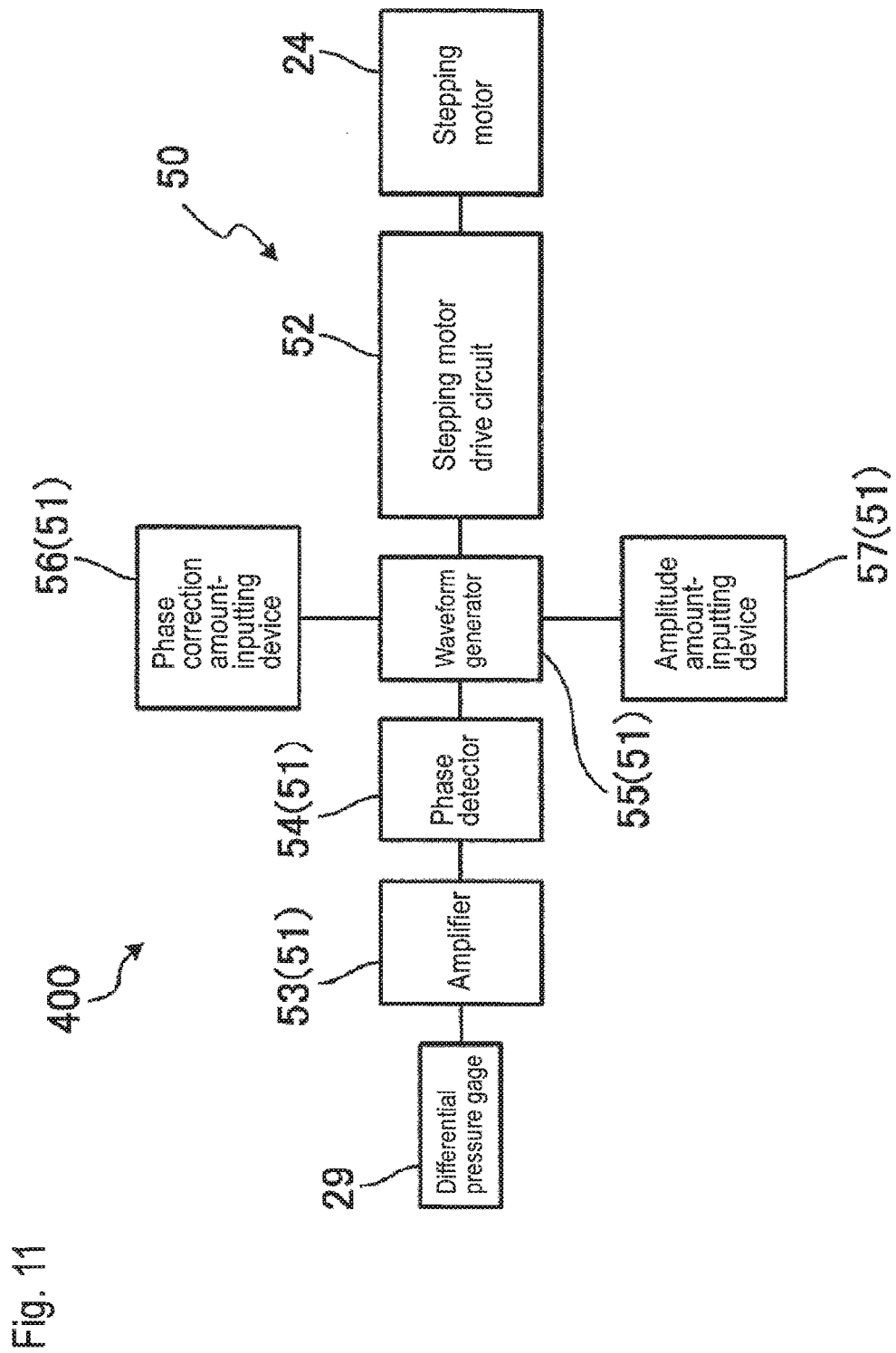
FIG. 11 is a circuit diagram of the gas phase volume-varying unit.

A cryostat 400 according to a fourth embodiment of the present invention is described below. With respect to the same components as the components described above, the same reference numerals are used, and the descriptions thereof are omitted. The cryostat 400 of this embodiment differs from the cryostat 100 of the first embodiment in that, as illustrated in FIG. 11 which is a circuit diagram, the varying device 21 (see, FIG. 2) is driven with a drive waveform which is in a substantially opposite phase to the waveform of the pressure fluctuation in the helium tank 2 and is produced by using the phase of the pressure fluctuation measured by the differential pressure gage 29.

The pressure fluctuation in the helium tank 2 is one of fluctuations generated by the liquefaction cycle of the refrigerator 5, and these fluctuations have in principle the same period. Therefore, in order to cancel out the pressure fluctuation in the helium tank 2, the varying device 21 may be driven with a drive waveform produced by using the phase of the fluctuation generated by the liquefaction cycle of the refrigerator 5, so that the gas phase volume in the gas-phase space 10 is varied. Here, when out of phases of fluctuations generated by the liquefaction cycle of the refrigerator 5, for example, two phases having an amplitude that becomes 0 are used, the period of the drive waveform can be obtained. In addition, when the phase of the drive waveform is reversed relative to the phase of the fluctuation generated by the liquefaction cycle of the refrigerator 5, the phase of the drive waveform can be made to be a substantially opposite phase to the waveform of the pressure fluctuation in the helium tank 2. Since the pressure fluctuation in the helium tank 2 measured by the differential pressure gage 29 is one of fluctuations generated by the liquefaction cycle of the refrigerator 5, the drive waveform can be appropriately produced by using the phase of the pressure fluctuation measured by the differential pressure gage 29. In this way, the drive waveform is one produced by separately setting the waveform or amplitude with use of the phase of the fluctuation generated by the liquefaction cycle of the refrigerator 5 and is not one obtained by using directly the waveform of the fluctuation generated by the liquefaction cycle of the refrigerator 5 and simply reversing the phase of the waveform. The drive waveform produced is fundamentally a sine curve, but it is sometimes preferable to slightly change the shape. Therefore, the drive waveform may be a waveform where a sine curve and a triangle wave are mixed each in a ratio of 50%. In addition, it may be produced as a waveform more suitable for suppressing the pressure fluctuation, for example, as a sine curve changed in the shape by making the rise of the sine curve to occur early and slowing the fall to an amplitude of zero, such that the amplitude is left as zero at 0° and 180° and has peaks at 80° and 260°. When a fluctuation of one period is stored in the memory by using a microcomputer, various arbitrary waveforms may also be used. The waveform of the pressure fluctuation detected is not used as it is, so that a best waveform to suppress the pressure fluctuation in the helium tank 2 can be selected. In an experimental example, the pressure fluctuation in the helium tank 2 can be more appropriately suppressed by further adjusting the phase by about 30° relative to the opposite phase of the pressure fluctuation measured by the differential pressure gage 29, and therefore, an optimal phase is selected based on the opposite phase. Thus, the phase of a drive waveform produced in the direction of canceling out the pressure fluctuation is referred to as an opposite phase, whereas the phase after applying an optimal correction based on the opposite phase is referred to as a substantially opposite phase. The characteristic change due to amplitude in addition to waveform or phase is great and therefore, a proper value needs to be selected.

Here, the period of the pressure fluctuation in the helium tank 2 is in principle the same as the period of the liquefaction cycle of the refrigerator 5 and is about 1.2 Hz. Therefore, the period of the liquefaction cycle of the refrigerator 5 may be used as the period of the drive waveform.

The gas phase volume-varying unit 50 provided in the cryostat 400 of this embodiment has a waveform-producing unit 51 for producing a drive waveform and a stepping motor drive circuit (driving unit) 52 for driving the varying device 21 with a drive waveform produced by the waveform-producing unit 51. The waveform-producing unit 51 has an amplifier 53 for amplifying the measurement signal measured by the differential pressure gage 29, a phase detector 54 for detecting a phase from the signal amplified by the amplifier 53, and a waveform generator 55 for producing a drive waveform (e.g., a sine curve or a triangle wave) in a substantially opposite phase to the waveform of the pressure fluctuation in the helium tank 2 by using the phase detected by the phase detector 54.

A phase correction amount-inputting device 56 for inputting a phase correction amount and an amplitude amount-inputting device 57 for inputting an amplitude amount are connected to the waveform generator 55, so that the phase correction amount and the amplitude amount can be externally set. By setting the phase correction amount and the amplitude amount as fixed values, the phase correction amount-inputting device 56 and the amplitude amount-inputting device 57 may be omitted.

The stepping motor drive circuit 52 drives the varying device 21 with a drive waveform produced by the waveform-producing unit 51 to vary the gas phase volume in the gas-phase space 10. In this way, the pressure fluctuation in the helium tank 2 can be appropriately canceled out.

In some cases, the pressure fluctuation can be more reduced when the phase of the produced drive waveform is delayed by about 30°, than when the varying device 21 is driven by using directly the drive waveform produced with use of the phase of the pressure fluctuation measured by the differential pressure gage 29. In this case, the phase of the drive waveform may be delayed by using the phase correction amount-inputting device 56. In addition, as indicated above, although the drive waveform produced is fundamentally a sine curve, it is sometimes preferable to slightly change the shape, and since the characteristic change due to amplitude is great, a proper value needs to be selected.

(Effects)

As described above, in the cryostat 400 according to this embodiment, a varying device 21 is driven, which is capable of varying the gas phase volume in the gas-phase space 10 with a drive waveform being in a substantially opposite phase to the waveform of the pressure fluctuation in the helium tank 2 and being produced by using the phase of the fluctuation generated by the liquefaction cycle of the refrigerator 5. The pressure fluctuation in the helium tank 2 is one of fluctuations generated by the liquefaction cycle of the refrigerator 5, and these fluctuations have in principle the same period. Therefore, in order to cancel out the pressure fluctuation in the helium tank 2, the varying device 21 may be driven with a drive waveform produced by using the phase of the fluctuation generated by the liquefaction cycle of the refrigerator 5, so that the gas phase volume in the gas-phase space 10 is varied. Here, when out of phases of fluctuations generated by the liquefaction cycle of the refrigerator 5, for example, two phases having an amplitude that becomes 0 are used, the period of the drive waveform can be obtained. In addition, when the phase of the drive waveform is reversed relative to the phase of the fluctuation generated by the liquefaction cycle of the refrigerator 5, the phase of the drive waveform can be made to be a substantially opposite phase to the waveform of the pressure fluctuation in the helium tank 2. The varying device 21 is driven with the thus-produced drive waveform to vary the gas phase volume in the gas-phase space 10, whereby the pressure fluctuation in the helium tank 2 can be appropriately canceled out. Furthermore, when the phase of the drive waveform is slightly phase-adjusted from the opposite phase, a proper waveform is selected or the amplitude is set to a proper value, the pressure fluctuation in the helium tank 2 can be more appropriately canceled out.

The phase of the pressure fluctuation measured by the differential pressure gage 29 which measures the pressure in the gas-phase space 10 or the recondensing chamber 8 is used as the phase of the fluctuation generated by the liquefaction cycle of the refrigerator 5 to produce a drive waveform. The pressure fluctuation in the helium tank 2 measured by the differential pressure gage 29 is one of fluctuations generated by the liquefaction cycle of the refrigerator 5 and therefore, the drive waveform can be appropriately produced by using the phase of the pressure fluctuation measured by the differential pressure gage 29.

Fifth Embodiment

Configuration of Gas Phase Volume-Varying Unit

Figure 12:
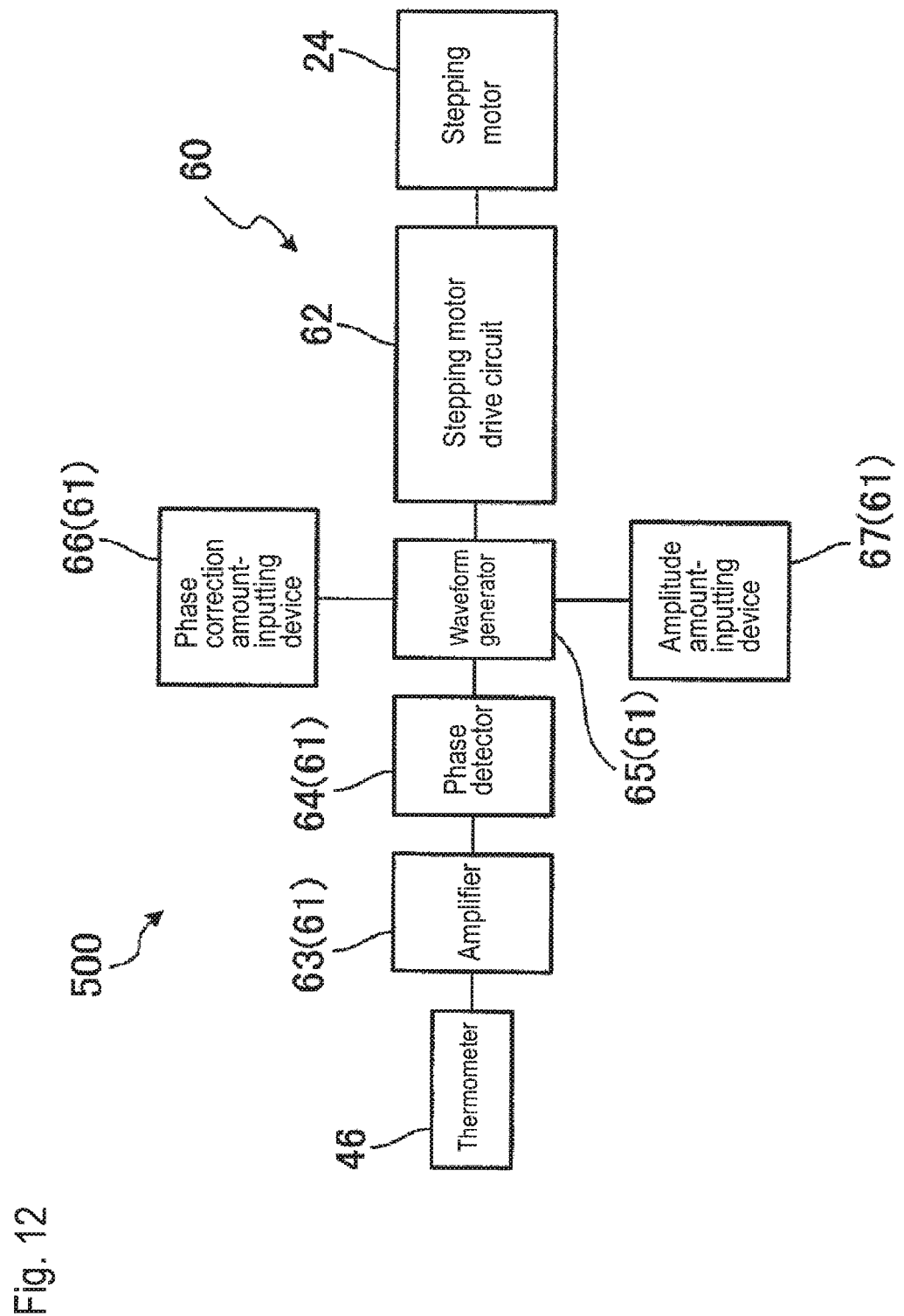
FIG. 12 is a circuit diagram of the gas phase volume-varying unit.

A cryostat 500 according to a fifth embodiment of the present invention is described below. With respect to the same components as the components described above, the same reference numerals are used, and the descriptions thereof are omitted. The cryostat 500 of this embodiment differs from the cryostat 400 of the fourth embodiment in that, as illustrated in FIG. 12 which is a circuit diagram, the gas phase volume-varying unit 60 provided in the cryostat 500 has, in place of the differential pressure gage 29, a thermometer (temperature-measuring unit) 46 for measuring the temperature of the refrigerator 5 and the drive waveform is produced by using the phase of the temperature fluctuation measured by the thermometer 46.

In this embodiment, the thermometer 46 is attached (not shown) to the second cooling stage 7 (see, FIG. 1) of the refrigerator 5 and measures the temperature of the second cooling stage 7.

The temperature fluctuation of the refrigerator 5 measured by the thermometer 46 is one of fluctuations generated by the liquefaction cycle of the refrigerator 5. Therefore, the drive waveform can be appropriately produced by using the phase of the temperature fluctuation measured by the thermometer 46.

The gas phase volume-varying unit 60 provided in the cryostat 500 of this embodiment has a waveform-producing unit 61 for producing a drive waveform and a stepping motor drive circuit (driving unit) 62 for driving the varying device 21 (see, FIG. 2) with a drive waveform produced by the waveform-producing unit 61. The waveform-producing unit 61 has an amplifier 63 for amplifying the measurement signal measured by the thermometer 46, a phase detector 64 for detecting a phase from the signal amplified by the amplifier 63, and a waveform generator 65 for producing a drive waveform (e.g., a sine curve or a triangle wave) in a substantially opposite phase to the waveform of the pressure fluctuation in the helium tank 2 by using the phase detected by the phase detector 64.

A phase correction amount-inputting device 66 for inputting a phase correction amount and an amplitude amount-inputting device 67 for inputting an amplitude amount are connected to the waveform generator 65, so that the phase correction amount and the amplitude amount can be externally set. By setting the phase correction amount and the amplitude amount as fixed values, the phase correction amount-inputting device 66 and the amplitude amount-inputting device 67 may be omitted.

The stepping motor drive circuit 62 drives the varying device 21 with a drive waveform produced by the waveform-producing unit 61 to vary the gas phase volume in the gas-phase space 10. In this way, the pressure fluctuation in the helium tank 2 can be appropriately canceled out.

A temperature fluctuation is generated in the refrigerator 5 by the liquefaction cycle of the refrigerator 5, and a pressure fluctuation is generated in the helium tank 2 by the temperature fluctuation. Therefore, in many cases, the phase of the temperature fluctuation is delayed by about 10° relative to the liquefaction cycle, and the phase of the pressure fluctuation is delayed by about 50° relative to the temperature fluctuation. Then, the pressure fluctuation can be sometimes more reduced when the phase of the produced drive waveform is delayed by about 50°, than when the varying device 21 is driven by using directly the drive waveform produced with use of the phase of the temperature fluctuation measured by the thermometer 46. In this case, the phase of the drive waveform may be delayed by using the phase correction amount-inputting device 66. In addition, as indicated above, although the drive waveform produced is fundamentally a sine curve, it is sometimes preferable to slightly change the shape, and since the characteristic change due to amplitude is great, a proper value needs to be selected.

(Effects)

As described above, in the cryostat 500 according to this embodiment, the phase of the temperature fluctuation measured by the thermometer 46 which measures the temperature of the refrigerator 5 is used as the phase of the fluctuation generated by the liquefaction cycle of the refrigerator 5 to produce a drive waveform. Since the temperature fluctuation of the refrigerator 5 measured by the thermometer 46 is one of fluctuations generated by the liquefaction cycle of the refrigerator 5, the drive waveform can be appropriately produced by using the phase of the temperature fluctuation measured by the thermometer 46. In addition, even when the pressure fluctuation in the helium tank 2 is reduced or substantially extinguished as a result of canceling out of the pressure fluctuation in the helium tank 2, the temperature fluctuation of the refrigerator 5 is almost unchanged. Accordingly, out of fluctuations generated by the liquefaction cycle of the refrigerator 5, a fluctuation except for the pressure fluctuation in the helium tank 2 is more suitable than the pressure fluctuation, because this fluctuation is not reduced (does not make the phase detection impossible) even when the pressure fluctuation in the helium tank 2 is canceled out. The varying device 21 is driven with the thus-produced drive waveform to vary the gas phase volume in the gas-phase space 10, whereby the pressure fluctuation in the helium tank 2 can be appropriately canceled out. Furthermore, when the phase of the drive waveform is slightly phase-adjusted from the opposite phase, a proper waveform is selected or the amplitude is set to a proper value, the pressure fluctuation in the helium tank 2 can be more appropriately canceled out.

Sixth Embodiment

Configuration of Gas Phase Volume-Varying Unit

Figure 13:
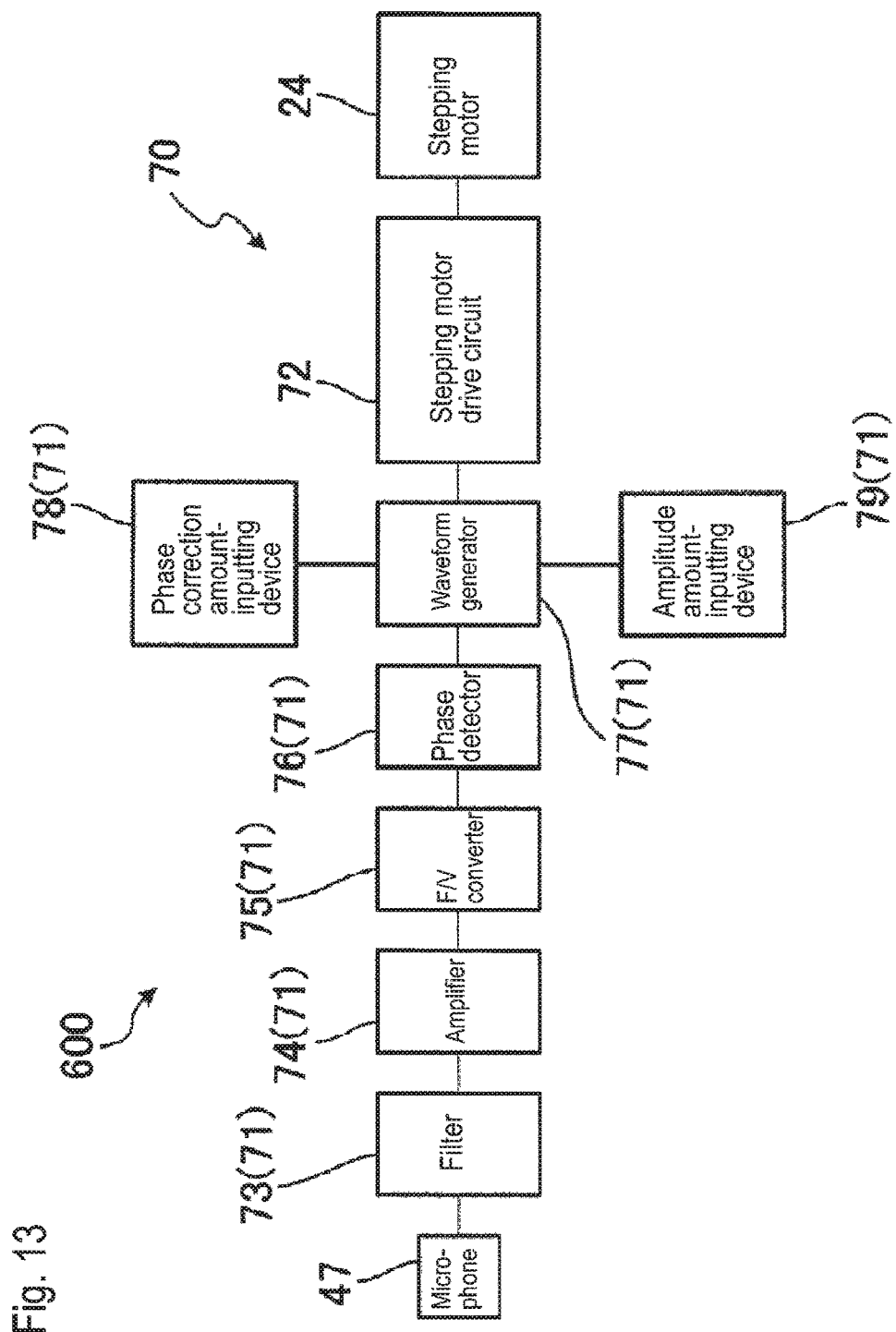
FIG. 13 is a circuit diagram of the gas phase volume-varying unit.

A cryostat 600 according to a sixth embodiment of the present invention is described below. With respect to the same components as the components described above, the same reference numerals are used, and the descriptions thereof are omitted. The cryostat 600 of this embodiment differs from the cryostat 400 of the fourth embodiment in that, as illustrated in FIG. 13 which is a circuit diagram, the gas phase volume-varying unit 70 provided in the cryostat 600 has, in place of the differential pressure gage 29, a microphone (sound-collecting unit) 47 for picking up a sound generated by the refrigerator 5 and the drive waveform is produced by using the phase of a change pattern of the sound picked up by the microphone 47.

In this embodiment, the microphone 47 is attached (not shown) to the side surface of the refrigerator 5 (see, FIG. 1). The refrigeration cycle of the refrigerator 5 is about 1.2 Hz, but the sound generated by the refrigerator 5 is a few kHz.

The generation of a sound from the refrigerator 5 picked up by the microphone 47 is one of fluctuations generated by the liquefaction cycle of the refrigerator 5.

Specifically, the refrigerator 5 makes a sound of "shupa, shupa". The tone color (frequency) differs between these "shu" and "pa" and therefore, can be changed into a voltage by the later-described F/V converter 75. One unit of the change of the sound "shupa" is about 1.2 Hz that is the same as the refrigeration cycle. Therefore, the drive waveform can be appropriately produced by using the phase of a change (change of tone color) pattern of the sound picked up by the microphone 47.

The gas phase volume-varying unit 70 provided in the cryostat 600 of this embodiment has a waveform-producing unit 71 for producing a drive waveform and a stepping motor drive circuit (driving unit) 72 for driving the varying device 21 (see, FIG. 2) with a drive waveform produced by the waveform-producing unit 71. The waveform-producing unit 71 has a filter 73 for extracting a sound in the required frequency band from the sounds picked up by the microphone 47, an amplifier 74 for amplifying the sound extracted by the filter 73, and an F/V converter 75 for changing the frequency into a voltage to provide a signal (signal capable of indicating the period of change of the tone color) having a period of about 1.2 H-z that is the same as the refrigeration cycle. The waveform-producing unit 71 has a phase detector 76 for detecting a phase from the output signal of the F/V converter 75 and a waveform generator 77 for producing a drive waveform (e.g., a sine curve or a triangle wave) in a substantially opposite phase to the waveform of the pressure fluctuation in the helium tank 2 by using the phase detected by the phase detector 76.

A phase correction amount-inputting device 78 for inputting a phase correction amount and an amplitude amount-inputting device 79 for inputting an amplitude amount are connected to the waveform generator 77, so that the phase correction amount and the amplitude amount can be externally set. By setting the phase correction amount and the amplitude amount as fixed values, the phase correction amount-inputting device 78 and the amplitude amount-inputting device 79 may be omitted.

The stepping motor drive circuit 72 drives the varying device 21 with a drive waveform produced by the waveform-producing unit 71 to vary the gas phase volume in the gas-phase space 10. In this way, the pressure fluctuation in the helium tank 2 can be appropriately canceled out.

In place of the microphone 47 for picking up a sound generated by the refrigerator 5, a vibration sensor (vibration-measuring unit) for measuring the vibration of the refrigerator 5 may be attached to the side surface of the refrigerator 5 to produce the drive waveform by using the phase of a change pattern of the vibration measured by the vibration sensor. Since the vibration of the refrigerator 5 measured by the vibration sensor is one of fluctuations generated by the liquefaction cycle of the refrigerator 5, the drive waveform can be appropriately produced by using the phase of a change pattern of the vibration measured by the vibration sensor.

The change pattern of the sound or vibration from the refrigerator 5 generated by the liquefaction cycle of the refrigerator 5 has substantially no delay in phase relative to the liquefaction cycle, whereas in many cases, the pressure fluctuation has a delay in phase by about 600 relative to the sound or vibration generated by the refrigerator 5, although this may vary depending on the place where the sound is collected by the microphone 47. Then, the pressure fluctuation can be sometimes more reduced when the phase of the produced drive waveform is delayed by about 60°, than when the varying device 21 is driven by using directly the drive waveform produced with use of the phase of a change pattern of the sound picked up by the microphone 47 or the vibration measured by the vibration sensor. In such a case, the phase of the drive waveform may be delayed by using the phase correction amount-inputting device 78. In addition, as indicated above, although the drive waveform produced is fundamentally a sine curve, it is sometimes preferable to slightly change the shape, and since the characteristic change due to amplitude is great, a proper value needs to be selected.

(Effects)

As described above, in the cryostat 600 according to this embodiment, the phase of a change pattern of the sound picked by the microphone 47 which picks up a sound generated by the refrigerator 5 is used as the phase of the fluctuation generated by the liquefaction cycle of the refrigerator 5 to produce a drive waveform. The generation of a sound from the refrigerator 5 picked up by the microphone 47 is one of fluctuations generated by the liquefaction cycle of the refrigerator 5. Therefore, the drive waveform can be appropriately produced by using the phase of a change pattern of the sound picked up by the microphone 47. The varying device 21 is driven with the thus-produced drive waveform to vary the gas phase volume in the gas-phase space 10, whereby the pressure fluctuation in the helium tank 2 can be appropriately canceled out. Furthermore, when the phase of the drive waveform is slightly phase-adjusted from the opposite phase, a proper waveform is selected or the amplitude is set to a proper value, the pressure fluctuation in the helium tank 2 can be more appropriately canceled out.

Seventh Embodiment

Configuration of Gas Phase Volume-Varying Unit

Figure 14:
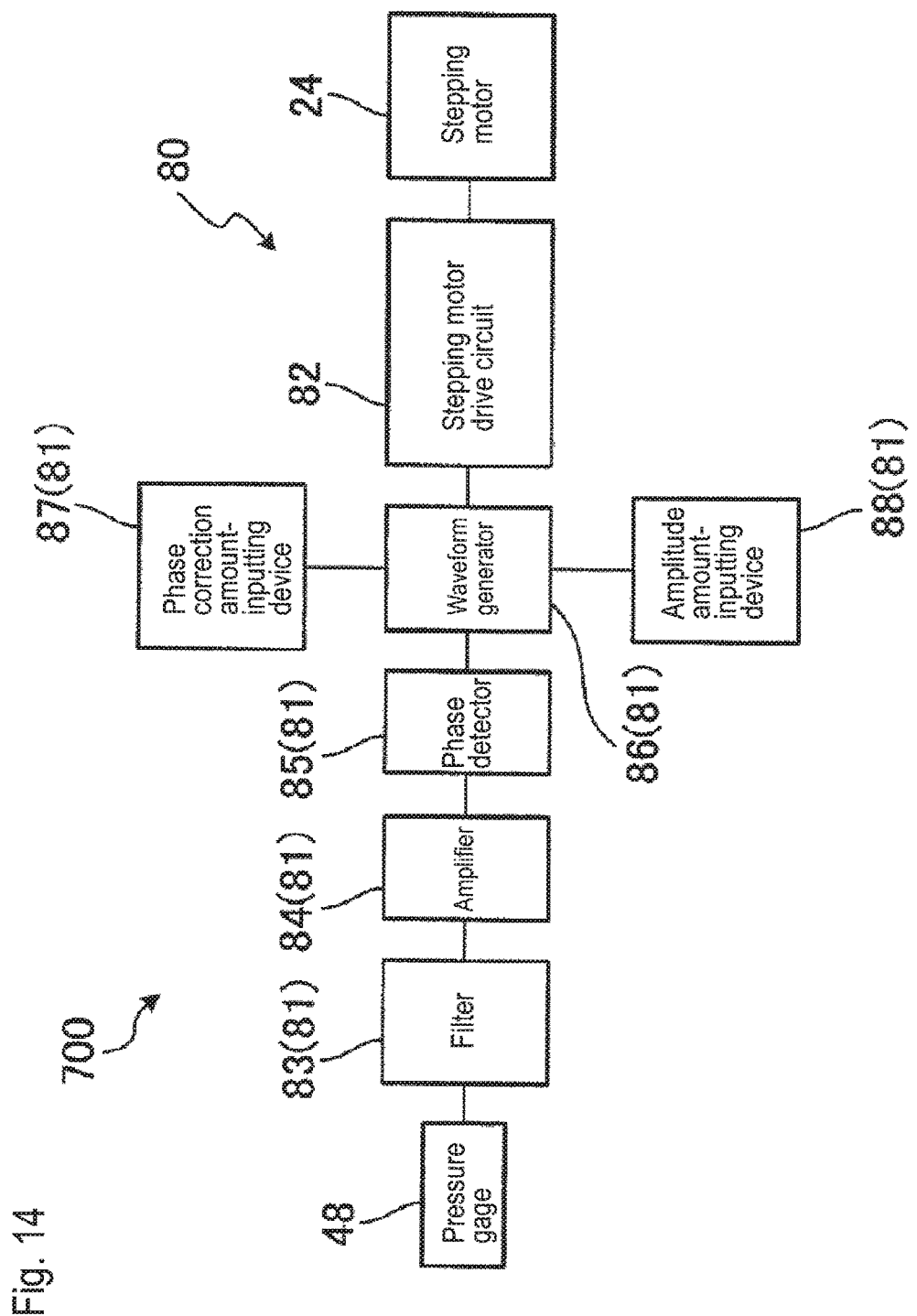
FIG. 14 is a circuit diagram of the gas phase volume-varying unit.

A cryostat 700 according to a seventh embodiment of the present invention is described below. With respect to the same components as the components described above, the Samna reference numerals are used, and the descriptions thereof are omitted. The cryostat 700 of this embodiment differs from the cryostat 400 of the fourth embodiment in that, as illustrated in FIG. 14 which is a circuit diagram, the gas phase volume-varying unit 80 provided in the cryostat 700 has, in place of the differential pressure gage 29, a pressure gage (refrigerator-side pressure-measuring unit) 48 for measuring the pressure of a coolant (helium) fed into the refrigerator 5 and the drive waveform is produced by using the phase of the pressure fluctuation measured by the pressure gage 48.

In this embodiment, the pressure gage 48 is provided (not shown) inside the refrigerator 5 (see, FIG. 1). The position at which the pressure gage 48 is provided is preferably on the downstream side of a rotary valve of the refrigerator 5 in view of ease of extraction of a, signal, but when the pressure on the high pressure side is measured by providing in the vicinity of a high-pressure gas inlet into which helium gas on the high pressure side flows, a pressure change right after changeover by the rotary value can be read.

The pressure fluctuation of the coolant fed into the refrigerator 5, which is measured by the pressure gage 48, is one of fluctuations generated by the liquefaction cycle of the refrigerator 5. Therefore, the drive waveform can be appropriately produced by using the phase of the pressure fluctuation measured by the pressure gage 48.

The gas phase volume-varying unit 80 provided in the cryostat 700 of this embodiment has a waveform-producing unit 81 for producing a drive waveform and a stepping motor drive circuit (driving unit) 82 for driving the varying device 21 (see, FIG. 2) with a drive waveform produced by the waveform-producing unit 81. The waveform-producing unit 81 has a filter 83 for extracting a signal in the required frequency band from the measurement signals measured by the pressure gage 48, an amplifier 84 for amplifying the signal extracted by the filter 83, a phase detector 85 for detecting a phase from the signal amplified by the amplifier 84, and a waveform generator 86 for producing a drive waveform (e.g., a sine curve or a triangle wave) in a substantially opposite phase to the waveform of the pressure fluctuation in the helium tank 2 by using the phase detected by the phase detector 85.

A phase correction amount-inputting device 87 for inputting a phase correction amount and an amplitude amount-inputting device 88 for inputting an amplitude amount are connected to the waveform generator 86, so that the phase correction amount and the amplitude amount can be externally set. By setting the phase correction amount and the amplitude amount as fixed values, the phase correction amount-inputting device 87 and the amplitude amount-inputting device 88 may be omitted.

The stepping motor drive circuit 82 drives the varying device 21 with a drive waveform produced by the waveform-producing unit 81 to vary the gas phase volume in the gas-phase space 10. In this way, the pressure fluctuation in the helium tank 2 can be appropriately canceled out.

The pressure fluctuation of a coolant generated by the liquefaction cycle of the refrigerator 5 is a change of the power source for driving the refrigerator 5 and has substantially no delay in phase relative to the liquefaction cycle but rather precedes a little. On the other hand, the phase of the pressure fluctuation is in many cases delayed by about 60° relative to the pressure fluctuation of the coolant fed into the refrigerator 5. Then, the pressure fluctuation can be sometimes more reduced when the phase of the produced drive waveform is delayed by about 60°, than when the varying device 21 is driven by using directly the drive waveform produced with use of the phase of the pressure fluctuation measured by the pressure gage 48. In such a case, the phase of the drive waveform may be delayed by using the phase correction amount-inputting device 87. In addition, as indicated above, although the drive waveform produced is fundamentally a sine curve, it is sometimes preferable to slightly change the shape, and since the characteristic change due to amplitude is great, a proper value needs to be selected.

(Effects)

As described above, in the cryostat 700 according to this embodiment, the phase of the pressure fluctuation measured by the pressure gage 48 which measures the pressure of the coolant charged into the refrigerator 5 is used as the phase of the fluctuation generated by the liquefaction cycle of the refrigerator 5 to produce a drive waveform. The pressure fluctuation of the coolant charged into the refrigerator 5, which is measured by the pressure gage 48, is one of fluctuations generated by the liquefaction cycle of the refrigerator 5. Therefore, the drive waveform can be appropriately produced by using the phase of the pressure fluctuation measured by the pressure gage 48. The varying device 21 is driven with the thus-produced drive waveform to vary the gas phase volume in the gas-phase space 10, whereby the pressure fluctuation in the helium tank 2 can be appropriately canceled out. Furthermore, when the phase of the drive waveform is slightly phase-adjusted from the opposite phase, a proper waveform is selected or the amplitude is set to a proper value, the pressure fluctuation in the helium tank 2 can be more appropriately canceled out.

Eighth Embodiment

Configuration of Cryostat

Figure 15:
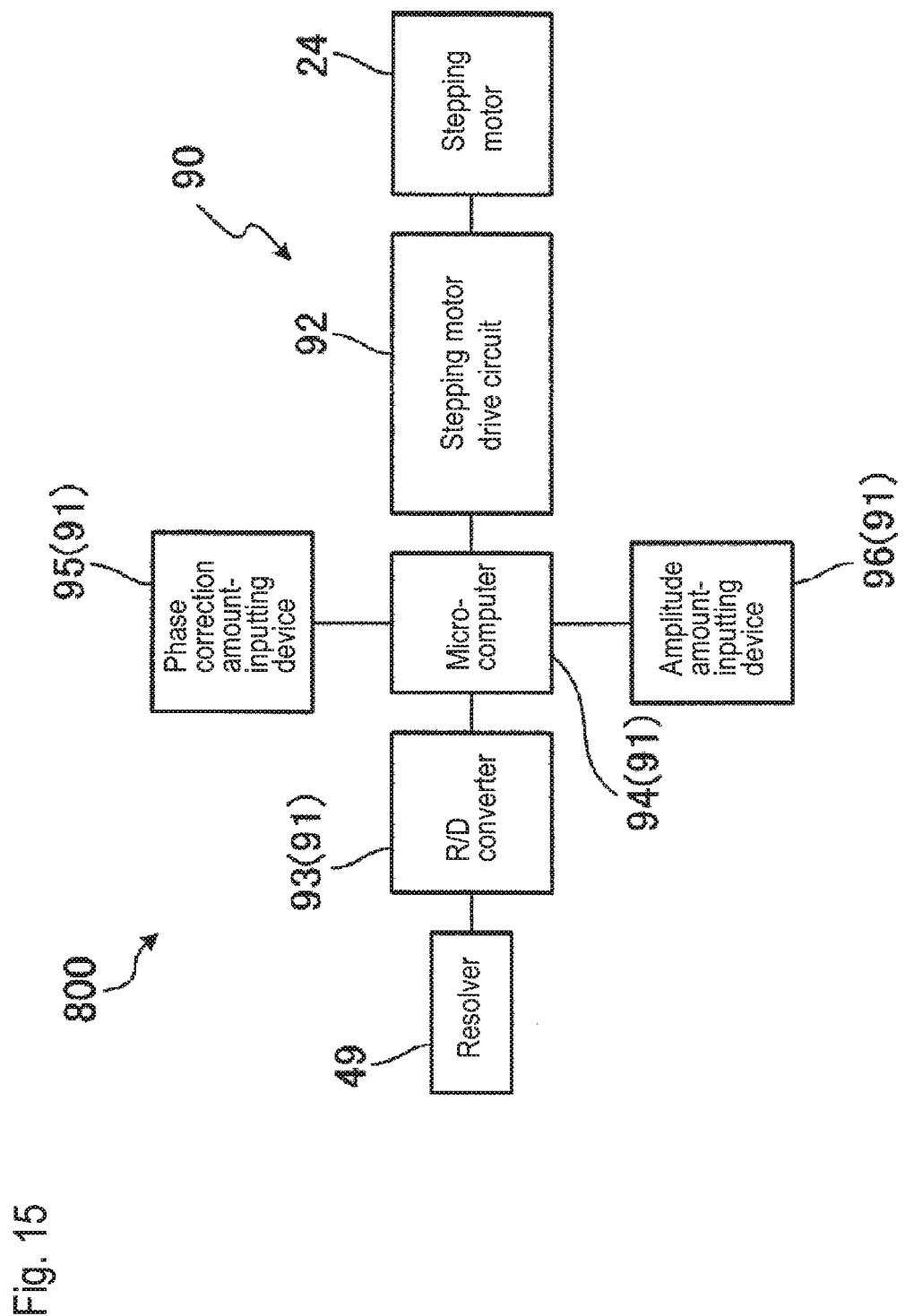
FIG. 15 is a circuit diagram of the gas phase volume-varying unit.

A cryostat 800 according to an eighth embodiment of the present invention is described below. With respect to the same components as the components described above, the same reference numerals are used, and the descriptions thereof are omitted. The cryostat 800 of this embodiment differs from the cryostat 400 of the fourth embodiment in that, as illustrated in FIG. 15 which is a circuit diagram, the gas phase volume-varying unit 90 provided in the cryostat 800 has, in place of the differential pressure gage 29, a resolver (rotation angle-detecting unit) 49 for detecting the rotation angle of a valve motor of the later-described refrigerator 101 and the drive waveform is produced by using the phase of the rotation of the valve motor detected by the resolver 49.

(Configuration of Refrigerator)

Figure 16:
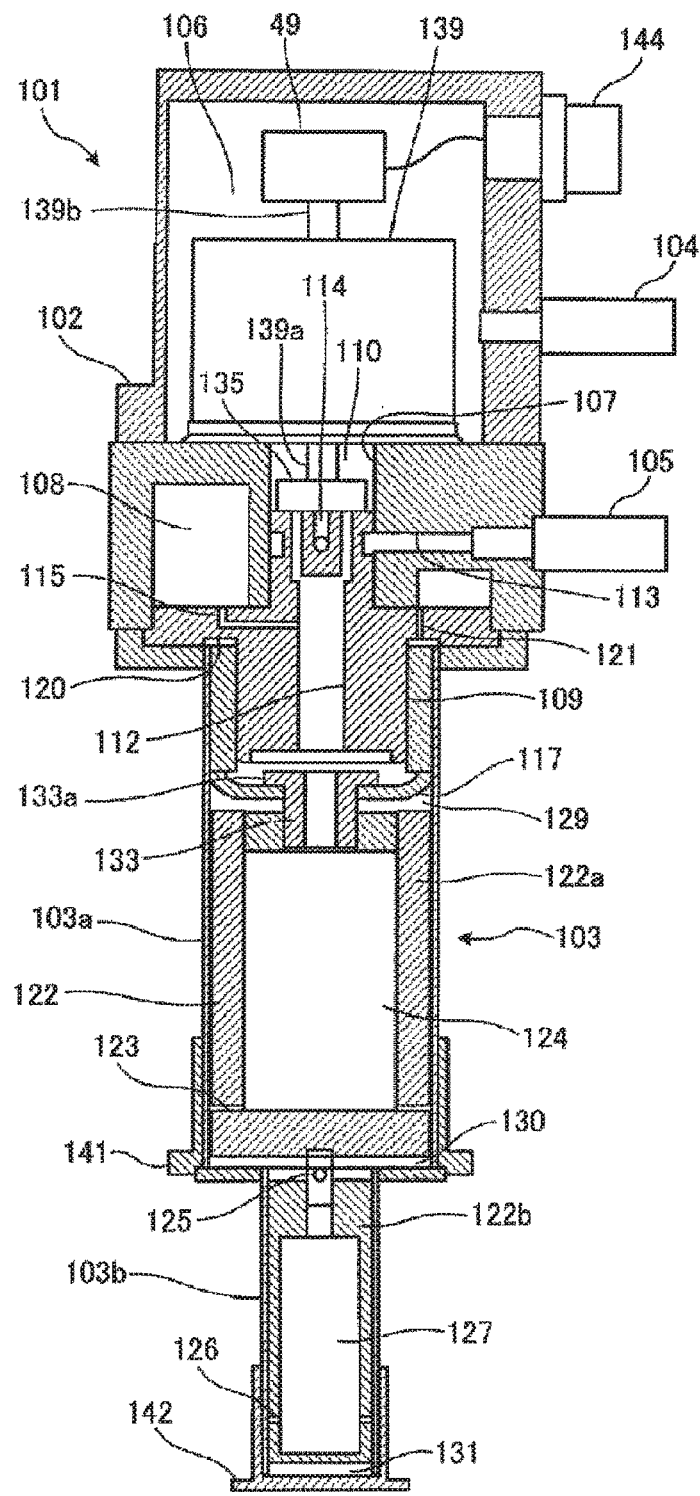
FIG. 16 is a cross-sectional view illustrating the configuration of the refrigerator.

The refrigerator 101 provided in the cryostat 800 of this embodiments is, as illustrated in FIG. 16, a GM refrigerator made up of an expander using a GM cycle (Gifford-McMahon cycle) in a gas pressure drive system of expanding a high-pressure helium gas (working gas) by allowing helium gas pressure to reciprocate a displacer 122 in a cylinder 103. The refrigerator 101 of this embodiment may be a pulse tube refrigerator.

The refrigerator 101 has a hermetically sealed motor head 102 and a cylinder 103 being airtightly provided to continue from the bottom surface of the motor head 102 and having a large/small two-step structure consisting of a large-diameter part 103a on the upper side and a small-diameter part 103b on the lower side. A high-pressure gas inlet 104 and a low-pressure gas outlet 105 positioned at a lower side thereof are formed on the side surface of the motor head 102. The high-pressure gas inlet 104 and the low-pressure gas outlet 105 are connected respectively to the ejection side of a compressor not-shown through a high-pressure pipeline and the suction side of the compressor through a low-pressure pipeline.

Inside the motor head 102, there are formed a motor chamber 106 communicating with the high-pressure gas inlet 104, an installation hole 107 being positioned at a lower side of the motor chamber 106 and communicating with the motor chamber 106, and an intermediate pressure chamber 108 composed of a substantially cyclic space positioned at a periphery of the installation hole 107.

In addition, a valve stem 109 constituting an occluding member at the upper end (proximate end) of the cylinder 103 is engagedly inserted into the boundary portion between the motor head 102 and the cylinder 103. A space surrounded by the top surface of the valve stem 109 and the wall surface of the installation hole 107 forms a valve chamber 110 communicating with the high-pressure gas inlet 104 through the motor chamber 106.

In the valve stem 109, a first gas passage 112 forking into two branches at the upper part thereof and allowing the valve chamber 110 to communicate with the inside of the cylinder 103, and a second gas passage 114 of which one end communicates with the first gas passage 112 through a low-pressure port of the later-described rotary valve 135 and another end communicates with the low-pressure gas outlet 105 through a communication passage 113 formed in the motor head 102, are penetratingly formed. The first gas passage 112 always communicates with the intermediate pressure chamber 108 through a capillary tube 115. The second gas passage 114 is opened to the central part of the valve stem 109 at the top surface of the valve stem 109 facing the valve chamber 110. The forked first gas passage 112 is opened to positions symmetrical relative to the second gas passage 114, at the top surface of the valve stem 109 facing the valve chamber 110.

On the other hand, a substantially cup-shaped slack piston 117 having a bottom wall is reciprocatably fitted externally to the upper end part in the large-diameter part 103a of the cylinder 103, in the state of the inner side surface thereof being slidably guided into the lower part of the valve stem 109. This slack piston 117 allows compartmentalization to form a lower-side pressure chamber 129 and an upper-side pressure chamber 120 in the lower part inside the cylinder 103 and at the upper end inside the cylinder 103, respectively. The upper-side pressure chamber 120 always communicates with the intermediate pressure chamber 108 inside the motor head 102 through an orifice 121. Accordingly, the upper-side pressure chamber 120 is set to an intermediate pressure between high pressure and low pressure of helium gas, and the pressure difference between respective gas pressures in the upper-side pressure chamber 120 and the lower-side pressure chamber 129 allows the slack piston 117 to reciprocate together with a displacer 122. A large-diameter central hole is penetratingly formed in the central part of the bottom wall of the slack piston 117, and a plurality of communication holes for establishing communication between the interior and the exterior of the slack piston 117 are formed in the peripheral corner part.

A displacer (displacing unit) 122 is reciprocatably fitted to the inside of the cylinder 103. The displacer 122 consists of a hermetically sealed cylindrical large-diameter part 122a sliding in the substantially lower part of the large-diameter part 103a of the cylinder 103, and a hermetically sealed cylindrical small-diameter part 122b being movably and integrally connected to the lower end of the large-diameter part 122a and sliding in the small-diameter part 103b of the cylinder 103. This displacer 122 divides an expansion space 129, 130 and 131 inside of the cylinder 103 in the lower part of the slack piston 117 into, in order from the upper side, the lower-side pressure chamber 129, a first-stage expansion chamber 130 and a second-stage expansion chamber 131. The space inside the large-diameter part 122a of the displacer 122 always communicates with the first expansion chamber 130 through a communication hole 123. In the space inside the large-diameter part 122a, a first-stage regenerator 124 composed of a regenerative heat exchanger is fittingly installed. The space inside the small-diameter part 122b of the displacer 122 always communicates respectively with the first expansion chamber 130 through a communication hole 125 and the second expansion chamber 131 through a communication hole 126. In the space inside the small-diameter part 122b of the displacer, a second-stage regenerator 127 similar to the first-stage regenerator 124 is fittingly installed.

A tubular locking piece 133 for establishing communication of the space inside the large-diameter part 122a with the lower-side pressure chamber 129 is integrally and projectingly provided at the upper end of the large-diameter part 122a of the displacer 122. The upper part of the locking piece 133 penetrates through the central hole on the bottom wall of the slack piston 117 and extends a predetermined dimension to the inside of the slack piston 117, and on the upper end part thereof, a flanged locking piece 133a engaging with the bottom wall of the slack piston 117 is integrally formed. In the case of downward movement of the slack piston 117, when the slack piston 117 descends by a predetermined stroke, the displacer 122 is driven by the slack piston 117 due to the abutting contact between the undersurface of the bottom wall thereof and the top surface of the displacer 122 and starts descending. On the other hand, in the case of upward movement of the slack piston 117, when the slack piston 117 ascends by a predetermined stroke, the displacer 122 is driven by the slack piston 117 due to the engagement between the upper surface of the bottom wall thereof and the locking part 133a of the locking piece 133 and starts ascending. In this way, the displacer 122 is configured to move following the slack piston 117 with a delay of a predetermined stroke.

Furthermore, a rotary valve 135 as a valve unit alternately switched between a high-pressure valve-opened state for feeding a high-pressure helium gas to the lower-side pressure chamber 129 and the expansion chambers 130 and 131, which are an expansion space inside the cylinder 103, and a low-pressure valve-opened state for discharging the helium gas from the lower-side pressure chamber 129 and the expansion chambers 130 and 131 is provided in the valve chamber 110 of the motor head 102. This rotary valve 135 is rotationally driven by a valve motor 139 arranged in the motor chamber 106. That is, an output shaft 139a of the valve motor 139 is rotationally and integrally engaged in the central part of the top surface of the rotary valve 135. On the undersurface of the rotary valve 135, a pair of high-pressure ports and a low-pressure port which is arranged at an angular interval of substantially 90° in the rotational direction of the rotary valve 135 with respect to the high-pressure port, are formed. By the switching operation of the rotary valve 135, the high-pressure gas inlet 104, i.e., the valve chamber 110 communicating with the high-pressure gas inlet 104, and the low-pressure gas outlet 105, i.e., the communication passage 113 communicating with the low-pressure gas outlet 105, are caused to alternately communicate with the lower-side pressure chamber 129 and the first-stage and second-stage expansion chambers 130 and 131 inside the cylinder 103. Then, a pressure difference is produced between the lower-side pressure chamber 129 and the upper-side pressure chamber 120, and due to this pressure difference, the slack piston 117 and the displacer 122 are caused to reciprocate inside the cylinder 103.

A first cooling stage 141 is provided at the distal end (lower end) of the large-diameter part 103a of the cylinder 103 and at the same time, a second cooling stage 142 is provided at the distal end (lower end) of the small-diameter part 103b of the cylinder 103.

In addition, in the refrigerator 101 of this embodiment, a resolver 49 is provided in the motor chamber 106. An output shaft 139b of the valve motor 139 is rotationally and integrally engaged with the resolver 49. The output shaft 139b is integrated with the output shaft 39a for rotating the rotary valve 135. The resolver 49 detects the rotation angle of the valve motor 139. The output signal from the resolver 49 is output to the outside through a metal connector 144 provided on the motor head 102.

(Operation of Refrigerator)

In such a configuration, in the state where the pressure inside the cylinder 103 in the refrigerator 101 is a low pressure and the slack piston 117 and the displacer 122 are at descending end positions, when the valve motor 139 is driven to rotate the rotary valve 135 and consequently, the high-pressure ports join with both open ends of the first gas passage 112 on the top surface of the valve stem 109, the rotary valve 135 is opened to the high-pressure side to provide a high-pressure valve-opened state. Then, a high-pressure helium gas at ordinary temperature fed in the valve chamber 110 through the high-pressure gas inlet 104 and motor chamber 106 of the refrigerator 101 is introduced into the lower-side pressure chamber 129 in the lower part of the slack piston 117 through the high-pressure ports of the rotary valve 135 and the first gas passage 112. Furthermore, the high-pressure helium gas at ordinary temperature sequentially passes through respective regenerators 124 and 127 of the displacer 122 from the lower-side pressure chamber 129 to fill each of the expansion chambers 130 and 131 and is cooled by heat exchange in the course of passing through the regenerators 124 and 127.

When the gas pressure in the lower-side pressure chamber 129 on the under side of the slack piston 117 becomes higher than that in the upper-side pressure chamber 120 on the top side, the slack piston 117 ascends due to the pressure difference between both pressure chambers 120 and 129. When the ascending stroke of the slack piston 117 reaches a predetermined value, the upper surface of the bottom wall of the slack piston 117 and the locking part 133a of the locking piece 133 are engaged, and the displacer 122 is pulled up by the slack piston 117 with a delay relative to the pressure change. This upward movement of the displacer 122 allows the expansion chambers 130 and 131 in the lower part thereof to be further filled with a high-pressure gas.

Subsequently, the rotary valve 135 is closed and even after this, the displacer 122 ascends by an inertial force. Following this, the helium gas in the lower-side pressure chamber 129 in the upper part of the displacer 122 moves to the expansion chambers 130 and 131.

After the displacer 122 reaches the ascending end position, the low-pressure port of the rotary valve 135 joins with the open end of the first gas passage 112 on the top surface of the valve stem 109, and the rotary valve 135 is opened to the low-pressure side to provide a low-pressure valve-opened state. Following the valve opening, the helium gas in each of the expansion chambers 130 and 131 in the lower part of the displacer 122 undergoes Simon expansion. Due to the temperature drop following the gas expansion, the first cooling stage 141 is cooled to a predetermined temperature level, and the second cooling stage 142 is cooled to a temperature level lower than the first cooling stage 141.

Contrary to the occasion of gas introduction, the helium gas reached a low-temperature state in the expansion chambers 130 and 131 returns to the lower-side pressure chamber 129 through the regenerators 124 and 127 inside the displacer 122 and in this process, cools the regenerators 124 and 127, and as a result, the temperature of itself rises to ordinary temperature. This helium gas at ordinary temperature is further discharged together with the gas in the lower-side pressure chamber 129 to the outside of the refrigerator 101 through the first gas passage 112, the low-pressure port of the rotary valve 135 and the communication passage 113, flows into a compressor through the low-pressure gas outlet 105, and is absorbed thereby. Following the gas discharge, the gas pressure in the lower-side pressure chamber 129 lowers and the slack piston 117 descends by the pressure difference with the upper-side pressure chamber 120. After the undersurface of the bottom wall of the slack piston 117 abuts against the top surface of the displacer 122, the displacer 122 is pushed and descends. By this downward movement of the displacer 122, the gas in the expansion chambers 130 and 131 is further discharged to the outside of the refrigerator 101.

Subsequently, the rotary valve 135 is closed, but even after this, the displacer 122 moves downward to the descending end position, and the gas in the expansion chambers 130 and 131 is discharged, restoring the initial state. This completes one cycle of the operation of the displacer 122, and thereafter, the same operation as above is repeated, whereby the temperatures of respective cooling stages 141 and 142 gradually drop toward cryogenic level.
(Configuration of Gas Phase Volume-Varying Unit)

Returning to FIG. 15, the gas phase volume-varying unit 90 provided in the cryostat 800 of this embodiment has a waveform-producing unit 91 for producing a drive waveform and a stepping motor drive circuit (driving unit) 92 for driving the varying device 21 (see, FIG. 2) with a drive waveform produced by the waveform-producing unit 91.

Here, the period of the pressure fluctuation in the helium tank 2 is in principle the same as the period of the liquefaction cycle of the refrigerator 101. Therefore, in order to cancel out the pressure fluctuation in the helium tank 2, the varying device 21 may be driven with a drive waveform produced by using the phase of the liquefaction cycle of the refrigerator 101 and thereby the gas phase volume in the gas-phase space 10 is varied. Here, when out of phases of the liquefaction cycle of the refrigerator 101, for example, two phases having an amplitude that becomes 0 are used, the period of the drive waveform can be obtained. In addition, when the phase of the drive waveform is reversed relative to the phase of the liquefaction cycle of the refrigerator 101, the phase of the drive waveform can be made to be a substantially opposite phase to the waveform of the pressure fluctuation in the helium tank 2. Since the liquefaction cycle occurs in the refrigerator 101 when the rotary valve 135 is rotated by the valve motor 139, the phase of the rotation of the valve motor 139 detected by the resolver 49 is the phase of the liquefaction cycle of the refrigerator 101. Accordingly, the drive waveform can be appropriately produced by using the phase of the rotation of the valve motor 139 detected by the resolver 49.

The resolver 49 outputs a sine curve in which, relative to the sine curve and cosine curve input, the phase angle is deviated due to rotation of the output shaft 139b. The waveform-producing unit 91 has an R/D converter 93 for convert-processing an output signal of the resolver 49 into digital angle data and a microcomputer 94 for producing a drive waveform (e.g., a sine curve or a triangle wave) in a substantially opposite phase to the waveform of the pressure fluctuation in the helium tank 2 by processing the convert-processed data.

A phase correction amount-inputting device 95 for inputting a phase correction amount and an amplitude amount-inputting device 96 for inputting an amplitude amount are connected to the microcomputer 94, so that the phase correction amount and the amplitude amount can be externally set. By setting the phase correction amount and the amplitude amount as fixed values, the phase correction amount-inputting device 95 and the amplitude amount-inputting device 96 may be omitted.

The stepping motor drive circuit 92 drives the varying device 21 with a drive waveform produced by the waveform-producing unit 91 to vary the gas phase volume in the gas-phase space 10. In this way, the pressure fluctuation in the helium tank 2 can be appropriately canceled out.

Here, since the liquefaction cycle occurs in the refrigerator 101 due to rotation of the valve motor 139, the phase delay of the rotation of the valve motor 139 is zero relative to the liquefaction cycle, whereas in many cases, the phase of the pressure fluctuation is delayed by about 60° relative to the liquefaction cycle of the refrigerator 101. Then, the pressure fluctuation can be sometimes more reduced when the phase of the produced drive waveform is delayed by about 60°, than when the varying device 21 is driven by using directly the drive waveform produced with use of the phase of the rotation of the valve motor 139 detected by the resolver 49. In such a case, the phase of the drive waveform may be delayed by using the phase correction amount-inputting device 95. In addition, as indicated above, although the drive waveform produced is fundamentally a sine curve, it is sometimes preferable to slightly change the shape, and since the characteristic change due to amplitude is great, a proper value needs to be selected.

Figure 17:
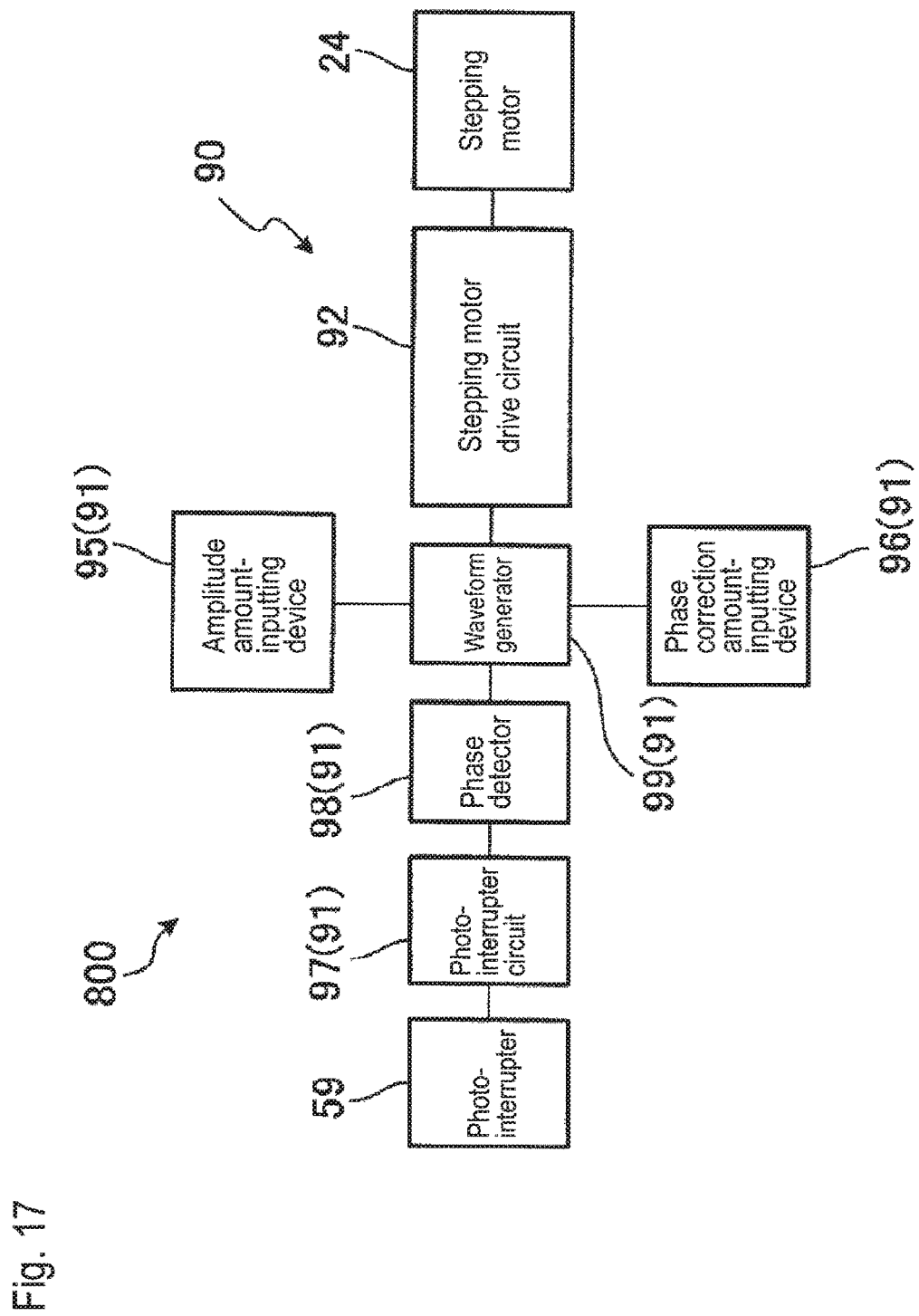
FIG. 17 is a circuit diagram of the gas phase volume-varying unit.

As illustrated in FIG. 17 which is a circuit diagram, a rotary encoder for measuring the rotation of the valve motor 139 may be used in place of the resolver 49 to extract a signal by a photointerrupter 59. The rotary encoder may be an absolute type of outputting a signal once by one rotation or may be an incremental type of outputting signals (A phase and B phase) detected by two pairs of photoelectric elements. In FIG. 17, an incremental rotary encoder of a type of outputting a pulse once by one rotation, called Z-phase, is used. A small magnetic material and a reed switch, a limit switch, etc. may be used in place of the photointerrupter 59.

A photointerrupter circuit 97 extracts a signal once per one rotation from the photointerrupter 59. A phase detector 98 detects a phase from the signal extracted by the photocoupler circuit 97. A waveform generator 99 produces a drive waveform (e.g., a sine curve or a triangle wave) in a substantially opposite phase to the waveform of the pressure fluctuation in the helium tank 2 by using the phase detected by the phase detector 98. As described above, it is sometimes preferable to adjust the phase of the produced drive form; although the drive waveform produced is fundamentally a sine curve, it is sometimes preferable to slightly change the shape; and since the characteristic change due to amplitude is great, a proper value needs to be selected.

In the case where the refrigerator 101 uses two valves in place of the rotary valve 135, the phase may be detected from on/off of the drive voltage of at least either one of these valves.
(Effects)

As described above, in the cryostat 800 according to this embodiment, a varying device 21 is driven, which is capable of varying the gas phase volume in the gas-phase space 10 with a drive waveform which is in a substantially opposite phase to the waveform of the pressure fluctuation in the helium tank 2 and is produced by using the phase of the liquefaction cycle of the refrigerator 101. The period of the pressure fluctuation in the helium tank 2 is in principle the same as the period of the liquefaction cycle of the refrigerator 101. Therefore, in order to cancel out the pressure fluctuation in the helium tank 2, the varying device 21 may be driven with a drive waveform produced by using the phase of the liquefaction cycle of the refrigerator 101 and thereby the gas phase volume in the gas-phase space 10 is varied. Here, when out of phases of the liquefaction cycle of the refrigerator 101, for example, two phases having an amplitude that becomes 0 are used, the period of the drive waveform can be obtained. In addition, when the phase of the drive waveform is reversed relative to the phase of the liquefaction cycle of the refrigerator 101, the phase of the drive waveform can be made to be a substantially opposite phase to the waveform of the pressure fluctuation in the helium tank 2. The varying device 21 is driven with the thus-produced drive waveform to vary the gas phase volume in the gas-phase space 10, whereby the pressure fluctuation in the helium tank 2 can be appropriately canceled out. Furthermore, when the phase of the drive waveform is slightly phase-adjusted from the opposite phase, a proper waveform is selected or the amplitude is set to a proper value, the pressure fluctuation in the helium tank 2 can be more appropriately canceled out.

In addition, the drive waveform is produced by using, as the phase of the liquefaction cycle of the refrigerator 101, the phase of the rotation of the valve motor 139 detected by the resolver 49 which detects the rotation angle of the valve motor 139. Since the liquefaction cycle occurs in the refrigerator 101 when the rotary valve 135 is rotated by the valve motor 139, the phase of the rotation of the valve motor 139 detected by the resolver 49 is the phase of the liquefaction cycle of the refrigerator 101. Accordingly, the drive waveform can be appropriately produced by using the phase of the rotation of the valve motor 139 detected by the resolver 49.

Ninth Embodiment

Configuration of Gas Phase Volume-Varying Unit

Figure 18:
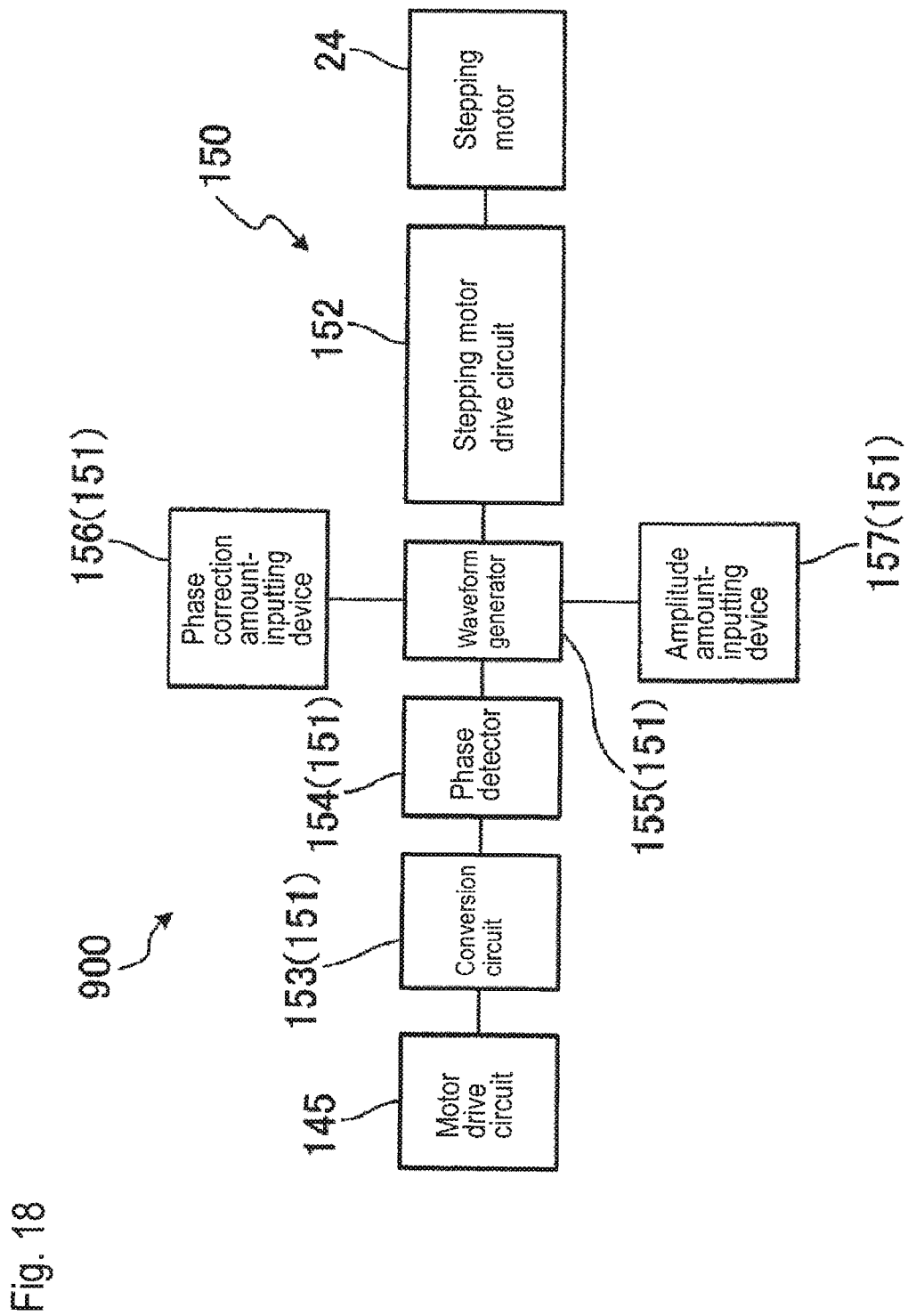
FIG. 18 is a circuit diagram of the gas phase volume-varying unit.

A cryostat 900 according to a ninth embodiment of the present invention is described below. With respect to the same components as the components described above, the same reference numerals are used, and the descriptions thereof are omitted. The cryostat 900 of this embodiment differs from the cryostat 800 of the eighth embodiment in that, as illustrated in FIG. 18 which is a circuit diagram, the gas phase volume-varying unit 150 provided in the cryostat 900 produces a drive waveform by using the phase of the drive signal of the valve motor 139 output from a motor drive circuit 145.

Since the liquefaction cycle occurs in the refrigerator 101 when the rotary valve 135 is rotated by the valve motor 139, the phase of the drive signal of the valve motor 139 is the phase of the liquefaction cycle of the refrigerator 101. Accordingly, the drive waveform can be appropriately produced by using the phase of the drive signal of the valve motor 139.

The gas phase volume-varying unit 150 provided in the cryostat 900 of this embodiment has a waveform-producing unit 151 for producing a drive waveform and a stepping motor drive circuit (driving unit) 152 for driving the varying device 21 (see, FIG. 2) with a drive waveform produced by the waveform-producing unit 151. The waveform-producing unit 151 has a conversion circuit 153 for converting, into a waveform signal, the drive signal output by the motor derive circuit 145 to the valve motor 139, a phase detector 154 for detecting a phase from the converted signal, and a waveform generator 155 for producing a drive waveform (e.g., a sine curve or a triangle wave) in a substantially opposite phase to the waveform of the pressure fluctuation in the helium tank 2 by using the phase detected by the phase detector 154.

A phase correction amount-inputting device 156 for inputting a phase correction amount and an amplitude amount-inputting device 157 for inputting an amplitude amount are connected to the waveform generator 155, so that the phase correction amount and the amplitude amount can be externally set. By setting the phase correction amount and the amplitude amount as fixed values, the phase correction amount-inputting device 156 and the amplitude amount-inputting device 157 may be omitted.

The stepping motor drive circuit 152 drives the varying device 21 with a drive waveform produced by the waveform-producing unit 151 to vary the gas phase volume in the gas-phase space 10. In this way, the pressure fluctuation in the helium tank 2 can be appropriately canceled out.

Here, since the liquefaction cycle occurs in the refrigerator 101 due to rotation of the valve motor 139, the phase delay of the drive signal of the valve motor 139 is zero relative to the liquefaction cycle, whereas in many cases, the phase of the pressure fluctuation is delayed by about 60° relative to the liquefaction cycle of the refrigerator 101. Then, the pressure fluctuation can be sometimes more reduced when the phase of the produced drive waveform is delayed by about 60°, than when the varying device 21 is driven by using directly the drive waveform produced with use of the phase of the drive signal of the valve motor 139. In such a case, the phase of the drive waveform may be delayed by using the phase correction amount-inputting device 156. In addition, as indicated above, although the drive waveform produced is fundamentally a sine curve, it is sometimes preferable to slightly change the shape, and since the characteristic change due to amplitude is great, a proper value needs to be selected.

(Effects)

As described above, in the cryostat 900 according to this embodiment, a drive waveform is produced by using the phase of the drive signal of the valve motor 139 as the phase of the liquefaction cycle of the refrigerator 101. Since the liquefaction cycle occurs in the refrigerator 101 when the rotary valve 135 is rotated by the valve motor 139, the phase of the drive signal of the valve motor 139 is the phase of the liquefaction cycle of the refrigerator 101. Accordingly, the drive waveform can be appropriately produced by using the phase of the drive signal of the valve motor 139. The varying device 21 is driven with the thus-produced drive waveform to vary the gas phase volume in the gas-phase space 10, whereby the pressure fluctuation in the helium tank 2 can be appropriately canceled out. Furthermore, when the phase of the drive waveform is slightly phase-adjusted from the opposite phase, a proper waveform is selected or the amplitude is set to a proper value, the pressure fluctuation in the helium tank 2 can be more appropriately canceled out.

(Modification Examples of Embodiments)

While the embodiments of the present invention are described above, these are to illustrate only specific examples and do not limit the present invention, and the specific configurations, etc. can be appropriately designed and changed. In addition, as to the actions and effects described in the embodiments of the present invention, the most suitable actions and effects obtainable by the present invention are only recited, and the actions and effects of the present invention are not limited to those described in the embodiments of the present invention.

For example, in the case where a helium pump is used as the power source of a pulse tube refrigerator, the drive waveform may be produced by using the phase of the drive signal of the moving coil of the helium pump as the phase of the liquefaction cycle of the refrigerator. In addition, such a helium pump may be arranged to communicate with the gas-phase space 10 and used in place of the varying device 21 or the varying device 31.

Furthermore, the gas phase volume of the gas-phase space 10 may be varied by attaching a speaker to a thin-plate portion provided in the helium tank 2 or the cylindrical member 15 and applying an acoustic effect from the speaker.

DESCRIPTION OF REFERENCE NUMERALS AND SIGNS

1: Superconducting magnet
2: Helium tank (coolant tank)
3: Radiation shield
4: Vacuum container
5: Refrigerator
6: First cooling stage
7: Second cooling stage
8: Recondensing chamber
10: Gas-phase space
11: Flexible tube
12: Neck member
13: Tube member
14: Communication member
15: Cylindrical member
16: Cylindrical member
20, 30, 40, 50, 60, 70, 80, 90, 150: Gas phase volume-varying unit
21, 31: Varying device
24: Stepping motor
26, 36, 41: Driving unit
27, 37, 42, 53, 63, 74, 84: Amplifier
28, 44, 52, 62, 72, 82, 92, 152: Stepping motor drive circuit
29: Differential pressure gage (pressure-measuring unit)
38, 162: Current amplifier
39, 43: Waveform shaper
45, 46: Thermometer (temperature-measuring unit)
47: Microphone (sound-collecting unit)
48: Pressure gage (refrigerator-side pressure-measuring unit)
49: Resolver (rotation angle-detecting unit)
51, 61, 71, 81, 91, 151: Waveform-producing unit
54, 64, 76, 85, 98, 154: Phase detector
55, 65, 77, 86, 99, 155: Waveform generator
56, 66, 78, 87, 95, 156: Phase correction amount-inputting device
57, 67, 79, 88, 96, 157: Amplitude amount-inputting device
59: Photointerrupter
73, 83: Filter
75: F/V Converter
93: R/D Converter
94: Microcomputer
97: Photointerrupter circuit
100, 200, 300, 400, 500, 600, 700, 800, 900: Cryostat
101: Refrigerator
135: Rotary valve
139: Valve motor
145: Motor drive circuit
153: Conversion circuit
161: Adder
163: DC Motor
164: Rotary encoder
165: Counter
166: D/A Converter

The invention claimed is:

1. A cryostat comprising:
a coolant tank housing a liquid coolant,
a refrigerator provided above the coolant tank, which recondenses the liquid coolant evaporated in the coolant tank,
a cylindrical member housing a lower part of the refrigerator and forming a recondensing chamber that fluidly communicates with the coolant tank, and
a variable volume container assembly fluidly communicating with a gas-phase space above a liquid surface of the liquid coolant in the coolant tank and which is controlled to vary a gas phase volume in the gas-phase space to cancel out a pressure fluctuation in the coolant tank.

2. The cryostat according to claim 1, wherein the variable volume container assembly fluidly communicates with the gas-phase space through the recondensing chamber.

3. The cryostat according to claim 1, wherein the variable volume container assembly comprises:
a variable volume container capable of varying the gas phase volume in the gas-phase space, and
a pressure sensor which measures a pressure in the gas-phase space or the recondensing chamber, and
wherein a volume of the variable volume container is controlled to generate, in the coolant tank, a pressure of a value in an opposite phase to a measured value of the pressure sensor.

4. The cryostat according to claim 1, wherein the variable volume container assembly comprises:
a variable volume container capable of varying the gas phase volume in the gas-phase space, and
a pressure sensor which measures a pressure in the gas-phase space or the recondensing chamber, and
wherein a volume of the variable volume container is controlled to generate, in the coolant tank, a pressure of a measured value of the pressure sensor or a pressure of a value in an opposite phase to the measured value after a predetermined time delay.

5. The cryostat according to claim 1, wherein the variable volume container assembly comprises:
a variable volume container capable of varying the gas phase volume in the gas-phase space, and
a temperature sensor which measures a temperature of the refrigerator, and
wherein a volume of the variable volume container is controlled with a waveform in an opposite phase to a waveform of a temperature fluctuation measured by the temperature sensor to cancel out the pressure fluctuation in the coolant tank.

6. The cryostat according to claim 1, wherein the variable volume container assembly comprises:
a variable volume container capable of varying the gas phase volume in the gas-phase space, and
a temperature sensor which measures a temperature of the refrigerator, and
wherein a volume of the variable volume container is controlled with a waveform phase-adjusted relative to a waveform of a temperature fluctuation measured by the temperature sensor to cancel out the pressure fluctuation in the coolant tank.

7. The cryostat according to claim 1, wherein the variable volume container assembly comprises:

a variable volume container capable of varying the gas phase volume in the gas-phase space, and a waveform generator which produces a drive waveform in a substantially opposite phase to a waveform of the pressure fluctuation in the coolant tank by using a phase of a fluctuation generated by a liquefaction cycle of the refrigerator, and wherein a volume of the variable volume container is controlled with the drive waveform produced by the waveform generator to cancel out the pressure fluctuation in the coolant tank.

8. The cryostat according to claim 7, wherein the variable volume container assembly comprises a pressure sensor which measures a pressure in the gas-phase space or the recondensing chamber, and the waveform generator produces the drive waveform by using a phase of a pressure fluctuation measured by the pressure sensor as the phase of the fluctuation generated by the liquefaction cycle of the refrigerator to cancel out the pressure fluctuation in the coolant tank.

9. The cryostat according to claim 7, wherein the variable volume container assembly further comprises a temperature sensor which measures a temperature of the refrigerator, and the waveform generator produces the drive waveform by using a phase of a temperature fluctuation measured by the temperature sensor as the phase of the fluctuation generated by the liquefaction cycle of the refrigerator to cancel out the pressure fluctuation in the coolant tank.

10. The cryostat according to claim 7, wherein the variable volume container assembly further comprises a sound collector which picks up a sound generated from the refrigerator, and the waveform generator produces the drive waveform by using a phase of a change pattern of the sound picked up by the sound collector as the phase of the fluctuation generated by the liquefaction cycle of the refrigerator to cancel out the pressure fluctuation in the coolant tank.

11. The cryostat according to claim 7, wherein the variable volume container assembly further comprises a vibration sensor which measures a vibration of the refrigerator, and the waveform generator produces the drive waveform by using a phase of a change pattern of the vibration measured by the vibration sensor as the phase of the fluctuation generated by the liquefaction cycle of the refrigerator to cancel out the pressure fluctuation in the coolant tank.

12. The cryostat according to claim 7, wherein the variable volume container assembly further comprises a refrigerator-side pressure sensor which measures a pressure of the coolant fed into the refrigerator, and the waveform generator produces the drive waveform by using a phase of a pressure fluctuation measured by the refrigerator-side pressure sensor as the phase of the fluctuation generated by the liquefaction cycle of the refrigerator to cancel out the pressure fluctuation in the coolant tank.

13. The cryostat according to claim 1, wherein the variable volume container assembly comprises:

a variable volume container capable of varying the gas phase volume in the gas-phase space, and a waveform generator which produces a drive waveform in a substantially opposite phase to a waveform of the pressure fluctuation in the coolant tank by using a phase of a liquefaction cycle of the refrigerator, and wherein a volume of the variable volume container is controlled with the drive waveform produced by the waveform generator to cancel out the pressure fluctuation in the coolant tank.

14. A cryostat comprising:

a coolant tank housing a liquid coolant, a refrigerator provided above the coolant tank, which recondenses the liquid coolant evaporated in the coolant tank, a cylindrical member housing a lower part of the refrigerator and forming a recondensing chamber that communicates with the coolant tank, and a variable volume container assembly communicating with a gas-phase space above a liquid surface of the liquid coolant in the coolant tank and varying a gas phase volume in the gas-phase space to cancel out a pressure fluctuation in the coolant tank, wherein the variable volume container assembly comprises:

a variable volume container capable of varying the gas phase volume in the gas-phase space, and a waveform generator which produces a drive waveform in a substantially opposite phase to a waveform of the pressure fluctuation in the coolant tank by using a phase of a liquefaction cycle of the refrigerator; and wherein a volume of the variable volume container is controlled with the drive waveform produced by the waveform generator, a valve is rotated by a motor in the refrigerator, the variable volume container assembly further comprises a rotation angle detector which detects a rotation angle of the motor, and the waveform generator produces the drive waveform by using a phase of a rotation of the motor, which has been detected by the rotation angle detector as the phase of the liquefaction cycle of the refrigerator.

15. A cryostat comprising:

a coolant tank housing a liquid coolant, a refrigerator provided above the coolant tank, which recondenses the liquid coolant evaporated in the coolant tank, a cylindrical member housing a lower part of the refrigerator and forming a recondensing chamber that communicates with the coolant tank, and a variable volume container assembly communicating with a gas-phase space above a liquid surface of the liquid coolant in the coolant tank and varying a gas phase volume in the gas-phase space to cancel out a pressure fluctuation in the coolant tank, wherein the variable volume container assembly comprises:

a variable volume container capable of varying the gas phase volume in the gas-phase space, and a waveform generator which produces a drive waveform in a substantially opposite phase to a waveform of the pressure fluctuation in the coolant tank by using a phase of a liquefaction cycle of the refrigerator; and wherein
- a volume of the variable volume container is controlled with the drive waveform produced by the waveform generator,
- a valve is rotated by a motor in the refrigerator, and
- the waveform generator produces the drive waveform by using a phase of a drive signal of the motor as the phase of the liquefaction cycle of the refrigerator.

16. The cryostat according to claim 1, wherein a superconducting magnet is housed in the coolant tank.

* * * * *